(12) United States Patent
Lim et al.

(10) Patent No.: US 11,462,170 B2
(45) Date of Patent: Oct. 4, 2022

(54) SCAN DRIVER AND DISPLAY DEVICE

(71) Applicant: Samsung Display Co., Ltd., Yongin-si (KR)

(72) Inventors: Jae Keun Lim, Suwon-si (KR); Jin Young Roh, Hwaseong-si (KR); Sehyuk Park, Seongnam-si (KR); Hyo Jin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/008,366

(22) Filed: Aug. 31, 2020

(65) Prior Publication Data

US 2021/0193048 A1    Jun. 24, 2021

(30) Foreign Application Priority Data

Dec. 18, 2019    (KR) .......................... 10-2019-0169868

(51) Int. Cl.
| | | |
|---|---|---|
| *G09G 3/3266* | (2016.01) | |
| *G11C 19/18* | (2006.01) | |
| *G09G 3/3258* | (2016.01) | |
| *G09G 3/3275* | (2016.01) | |
| *G09G 3/36* | (2006.01) | |

(Continued)

(52) U.S. Cl.
CPC ......... *G09G 3/3266* (2013.01); *G09G 3/3233* (2013.01); *G09G 3/3258* (2013.01); *G09G 3/3275* (2013.01); *G09G 3/3677* (2013.01); *G11C 19/188* (2013.01); *G09G 2300/0814* (2013.01); *G09G 2310/0286* (2013.01); *G09G 2310/08* (2013.01); *G09G 2320/103* (2013.01); *G09G 2330/023* (2013.01); *G11C 19/287* (2013.01)

(58) Field of Classification Search
CPC .. G09G 3/3648; G09G 3/3677; G09G 3/3266; G09G 2330/021; G09G 2310/08; G09G 2310/0286; G09G 2310/0267; G09G 3/20; G09G 3/3674; G09G 2310/0289; G06F 3/0412; G06F 3/04166; G06F 3/0416; G06F 3/038; G11C 19/188; G11C 19/287; G11C 19/28
See application file for complete search history.

(56) References Cited

U.S. PATENT DOCUMENTS

| | | | | |
|---|---|---|---|---|
| 7,872,628 B2* | 1/2011 | Cho | ..................... | G11C 19/28 345/94 |
| 8,502,810 B2* | 8/2013 | Yoshinaga | ........... | H04N 13/398 345/211 |

(Continued)

*Primary Examiner* — Dismery Mercedes
(74) *Attorney, Agent, or Firm* — Lewis Roca Rothgerber Christie LLP

(57) ABSTRACT

A scan driver includes: a plurality of first stages configured to sequentially output a plurality of intermediate scan signals based on a scan start signal; a plurality of masking transistors respectively connected to a plurality of output terminals of the plurality of first stages, and configured to selectively transfer the plurality of intermediate scan signals in response to a masking signal, respectively; and a plurality of second stages including a plurality of input terminals respectively connected to the plurality of masking transistors, and configured to selectively output a plurality of scan signals based on the plurality of intermediate scan signals selectively transferred by the plurality of masking transistors.

20 Claims, 11 Drawing Sheets

(51) Int. Cl.
  *G09G 3/3233* (2016.01)
  *G11C 19/28* (2006.01)

(56) References Cited

U.S. PATENT DOCUMENTS

| | | | | |
|---|---|---|---|---|
| 8,514,163 | B2* | 8/2013 | Pak | G09G 3/3677 |
| | | | | 345/99 |
| 9,799,286 | B2* | 10/2017 | Zhao | G09G 3/3677 |
| 9,847,054 | B2* | 12/2017 | Hwang | G09G 3/3266 |
| 10,198,998 | B2* | 2/2019 | In | G09G 3/3225 |
| 10,762,975 | B2* | 9/2020 | Li | G11C 19/287 |
| 11,244,629 | B2* | 2/2022 | Cho | G09G 3/3266 |
| 2008/0079676 | A1* | 4/2008 | Pak | G09G 3/3677 |
| | | | | 345/87 |
| 2010/0295837 | A1* | 11/2010 | Yoshinaga | G09G 3/3677 |
| | | | | 345/211 |
| 2011/0187691 | A1* | 8/2011 | Chung | G09G 5/00 |
| | | | | 345/204 |
| 2015/0161958 | A1* | 6/2015 | Hsu | G11C 19/28 |
| | | | | 345/99 |
| 2016/0111055 | A1* | 4/2016 | Na | G09G 3/3666 |
| | | | | 345/94 |
| 2016/0217728 | A1* | 7/2016 | In | G09G 3/2096 |
| 2016/0351160 | A1* | 12/2016 | In | G09G 3/3225 |
| 2019/0139617 | A1* | 5/2019 | Sasaki | G09G 3/3677 |

* cited by examiner

SCAN DRIVER AND DISPLAY DEVICE

CROSS-REFERENCE TO RELATED APPLICATION

The present application claims priority to and the benefit of Korean Patent Application No. 10-2019-0169868, filed on Dec. 18, 2019 in the Korean Intellectual Property Office (KIPO), the entire disclosure of which is incorporated herein by reference in its entirety.

BACKGROUND

1. Field

Aspects of some example embodiments relate to a scan driver and a display device.

2. Description of the Related Art

Reduction of power consumption may be desirable in a display device employed in a portable device, such as a smartphone, a tablet computer, etc., for example, in order to preserve battery life. For example, in order to reduce the power consumption of the display device, a low frequency driving technique, which drives or refreshes a display panel at a frequency lower than a normal driving frequency, may be utilized.

However, in a display device to which the low frequency driving technique is applied, when a still image is not displayed in an entire region of a display panel, or when the still image is displayed only in a partial region of the display panel, the entire region of the display panel may be driven at the normal driving frequency. Thus, in this case, the low frequency driving may not be performed, and the power consumption may not be reduced.

The above information disclosed in this Background section is only for enhancement of understanding of the background and therefore the information discussed in this Background section does not necessarily constitute prior art.

SUMMARY

Aspects of some example embodiments relate to a scan driver and a display device, and for example, to a scan driver and a display device capable of performing multi-frequency driving (MFD).

Aspects of some example embodiments include a scan driver capable of providing a plurality of scan signals at different driving frequencies to a plurality of panel regions.

Aspects of some example embodiments include a display device including the scan driver.

According to some example embodiments, a scan driver includes a plurality of first stages configured to sequentially output a plurality of intermediate scan signals based on a scan start signal, a plurality of masking transistors respectively connected to a plurality of output terminals of the plurality of first stages, and configured to selectively transfer the plurality of intermediate scan signals in response to a masking signal, respectively, and a plurality of second stages including a plurality of input terminals respectively connected to the plurality of masking transistors, and configured to selectively output a plurality of scan signals based on the plurality of intermediate scan signals selectively transferred by the plurality of masking transistors.

According to some example embodiments, the plurality of first stages may sequentially output all of the plurality of intermediate scan signals in a frame period, and the plurality of second stages may not output at least a portion of the plurality of scan signals in a hold period of the frame period.

According to some example embodiments, the masking signal may be changed to an off level before one horizontal time from a start time point of the hold period, and may be changed to an on level before one horizontal time from an end time point of the hold period.

According to some example embodiments, each of the plurality of masking transistors may not transfer a corresponding one of the plurality of intermediate scan signals in response to the masking signal having the off level, and may transfer the corresponding one of the plurality of intermediate scan signals to a corresponding one of the plurality of second stages in response to the masking signal having the on level.

According to some example embodiments, each of the plurality of masking transistors may include a gate for receiving the masking signal, a first terminal connected to a corresponding one of the plurality of output terminals of the plurality of first stages, and a second terminal connected to a corresponding one of the plurality of input terminals of the plurality of second stages.

According to some example embodiments, each of the plurality of scan signals selectively output from the plurality of second stages may be delayed by one horizontal time with respect to a corresponding one of the plurality of intermediate scan signals output from the plurality of first stages.

According to some example embodiments, a K-th one of the plurality of first stages may output a K-th one of the plurality of intermediate scan signals based on a (K−1)-th one of the plurality of intermediate scan signals output from a (K−1)-th one of the plurality of first stages, where K is an integer greater than 1, and a K-th one of the plurality of second stages may selectively output a K-th one of the plurality of scan signals based on the K-th one of the plurality of intermediate scan signals selectively transferred by a K-th one of the plurality of masking transistors.

According to some example embodiments, each of the plurality of second stages may have a structure substantially a same as a structure of each of the plurality of first stages.

According to some example embodiments, each of the plurality of first stages and the plurality of second stages may include an input circuit configured to transfer an input signal to a first node in response to a first clock signal, a stress relaxing circuit located between the first node and a second node, and configured to transfer the input signal from the first node to the second node such that a voltage of the second node is changed to a first on level, a bootstrap circuit configured to change the voltage of the second node from the first on level to a second on level by bootstrapping the second node based on a second clock signal, the second on level having an absolute value greater than an absolute value of the first on level, a scan output circuit configured to output the second clock signal as an output signal in response to the voltage of the second node having the second on level, a holding circuit configured to hold a third node as an off level while the output signal is output, and a stabilizing circuit configured to periodically apply a gate on voltage to the third node in response to the second clock signal, and to periodically apply a gate off voltage to the first node in response to the first clock signal after the output signal is output.

According to some example embodiments, the input circuit may include a first transistor including a gate for receiving the first clock signal, a first terminal for receiving the input signal, and a second terminal connected to the first node, the bootstrap circuit may include a first capacitor including a first electrode connected to a scan output node at which the output signal is output, and a second electrode connected to the second node, the holding circuit may include a fourth transistor including a gate connected to the first node, a first terminal connected to the third node, and a second terminal for receiving the first clock signal, the stabilizing circuit may include a second transistor including a gate connected to the third node, a first terminal for receiving the gate off voltage, and a second terminal, a third transistor including a gate for receiving the second clock signal, a first terminal connected to the second terminal of the second transistor, and a second terminal connected to the first node, a fifth transistor including a gate for receiving the first clock signal, a first terminal connected to the third node, and a second terminal for receiving the gate on voltage, and a second capacitor including a first electrode for receiving the gate off voltage, and a second electrode connected to the third node, the scan output circuit may include a sixth transistor including a gate connected to the third node, a first terminal for receiving the gate off voltage, and a second terminal connected to the scan output node, and a seventh transistor including a gate connected to the second node, a first terminal connected to the scan output node, and a second terminal for receiving the second clock signal, and the stress relaxing circuit may include an eighth transistor including a gate for receiving the gate on voltage, a first terminal connected to the first node, and a second terminal connected to the second node.

According to some example embodiments, a K-th one of the plurality of first stages may output a K-th one of the plurality of intermediate scan signals based on a previous carry signal output from a (K−1)-th one of the plurality of first stages, where K is an integer greater than 1, and a K-th one of the plurality of second stages may selectively output a K-th one of the plurality of scan signals based on the K-th one of the plurality of intermediate scan signals selectively transferred by a K-th one of the plurality of masking transistors.

According to some example embodiments, compared with each of the plurality of second stages, each of the plurality of first stages may further include a carry output circuit.

According to some example embodiments, the carry output circuit may include a ninth transistor including a gate connected to a third node, a first terminal for receiving a gate off voltage, and a second terminal connected to a carry output node at which a carry signal is output, and a tenth transistor including a gate connected to a second node, a first terminal connected to the carry output node, and a second terminal for receiving a second clock signal.

According to some example embodiments, the scan driver may further include a plurality of switching transistors configured to transfer a gate off voltage to the plurality of input terminals of the plurality of second stages in response to an inverted masking signal that is an inversion signal of the masking signal.

According to some example embodiments, each of the plurality of switching transistors may include a gate for receiving the inverted masking signal, a first terminal for receiving the gate off voltage, and a second terminal connected to a corresponding one of the plurality of input terminals of the plurality of second stages.

According to some example embodiments, the plurality of scan signals may be selectively provided to a plurality of pixels included in a display device including the scan driver, and the plurality of intermediate scan signals may be provided as a plurality of initialization signals to the plurality of pixels.

According to some example embodiments, a display device includes a display panel including a plurality of pixel rows, a data driver configured to provide data signals to each of the plurality of pixel rows, a scan driver configured to respectively provide a plurality of scan signals to the plurality of pixel rows, and a controller configured to control the data driver and the scan driver, and to provide a scan start signal and a masking signal to the scan driver. The scan driver includes a plurality of first stages configured to sequentially output a plurality of intermediate scan signals based on the scan start signal, a plurality of masking transistors respectively connected to a plurality of output terminals of the plurality of first stages, and configured to selectively transfer the plurality of intermediate scan signals in response to the masking signal, respectively, and a plurality of second stages including a plurality of input terminals respectively connected to the plurality of masking transistors, and configured to selectively output a plurality of scan signals based on the plurality of intermediate scan signals selectively transferred by the plurality of masking transistors.

According to some example embodiments, the plurality of first stages may sequentially output all of the plurality of intermediate scan signals in a frame period, and the plurality of second stages may not output at least a portion of the plurality of scan signals in a hold period of the frame period.

According to some example embodiments, the controller may include a still image detection block configured to divide input image data into a plurality of panel region data for a plurality of panel regions each including at least one of the plurality of pixel rows, and to determine whether or not each of the plurality of panel region data represents a still image, a driving frequency decision block configured to determine a plurality of driving frequencies for the plurality of panel regions according to whether or not each of the plurality of panel region data represents the still image, and a scan driver control block configured to generate the masking signal based on the plurality of driving frequencies for the plurality of panel regions.

According to some example embodiments, the scan driver control block may set at least a portion of one or more frame periods as a hold period, may change the masking signal to an off level before one horizontal time from a start time point of the hold period, and may change the masking signal to an on level before one horizontal time from an end time point of the hold period.

As described above, in a scan driver and a display device according to some example embodiments, a plurality of first stages may sequentially output a plurality of intermediate scan signals, a plurality of masking transistors may selectively transfer the plurality of intermediate scan signals in response to a masking signal, respectively, and a plurality of second stages may selectively output a plurality of scan signals based on the plurality of intermediate scan signals that is selectively transferred by the plurality of masking transistors. Accordingly, the scan driver according to some example embodiments may provide the plurality of scan signals at different driving frequencies to a plurality of panel regions.

BRIEF DESCRIPTION OF THE DRAWINGS

Illustrative, non-limiting example embodiments will be more clearly understood from the following detailed description in conjunction with the accompanying drawings.

DETAILED DESCRIPTION

Hereinafter, aspects of some example embodiments of the present inventive concept will be explained in more detail with reference to the accompanying drawings.

Figure 1:
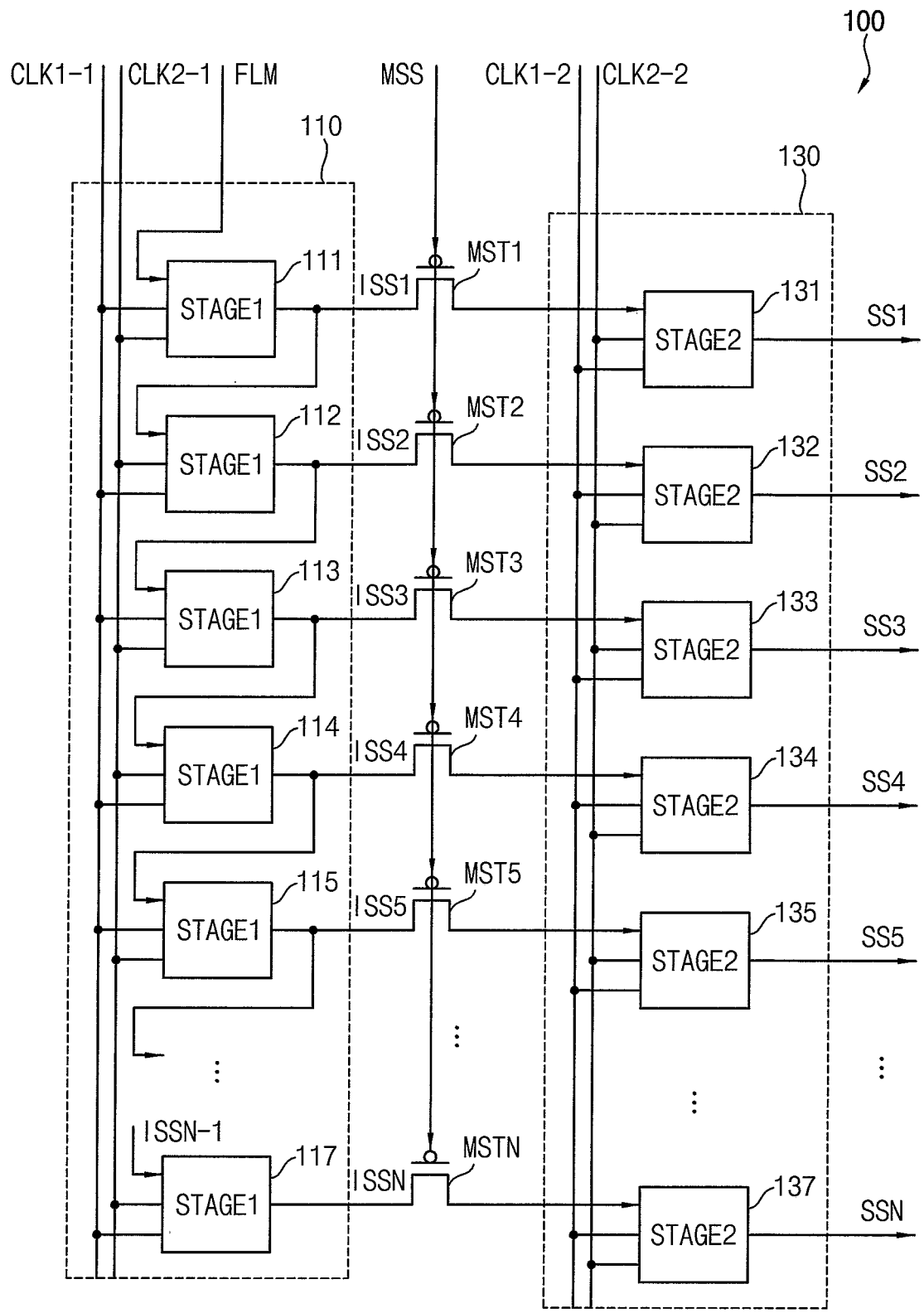
FIG. 1 is a block diagram illustrating a scan driver according to some example embodiments.
Figure 2:
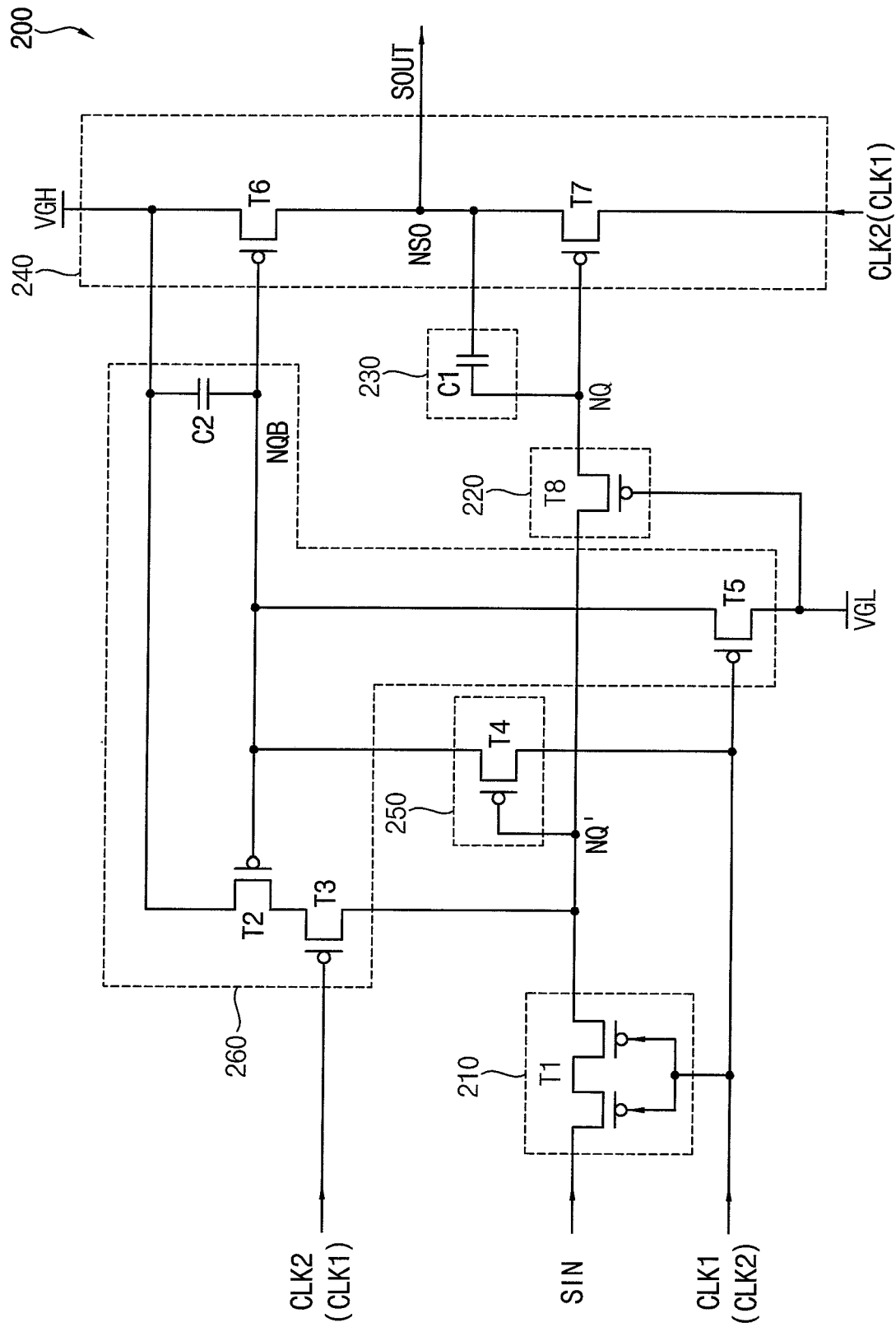
FIG. 2 is a circuit diagram illustrating an example of each first stage or each second stage included in a scan driver according to some example embodiments.
Figure 3:
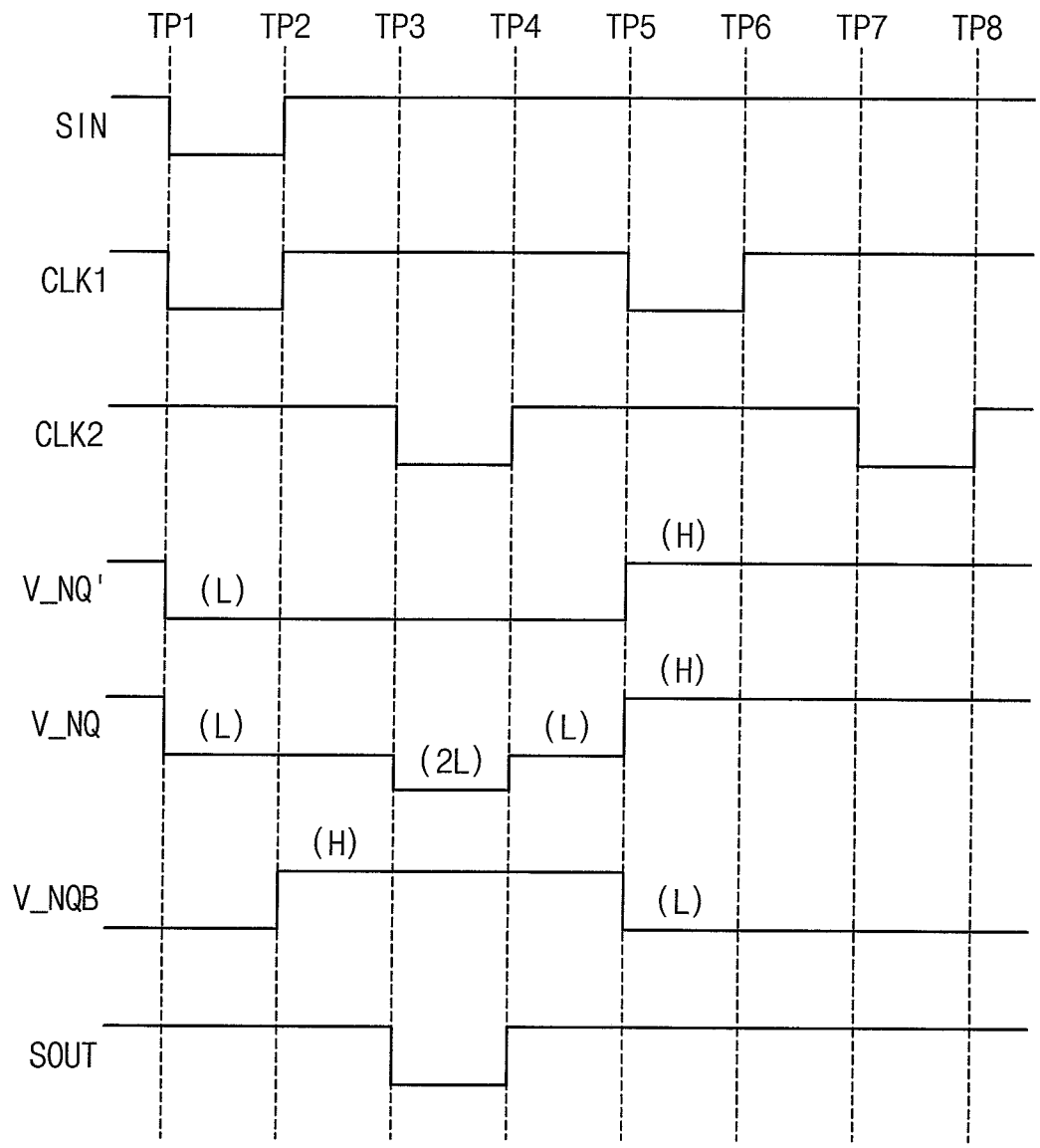
FIG. 3 is a timing diagram for describing an example of an operation of a stage of FIG. 2.
Figure 4:
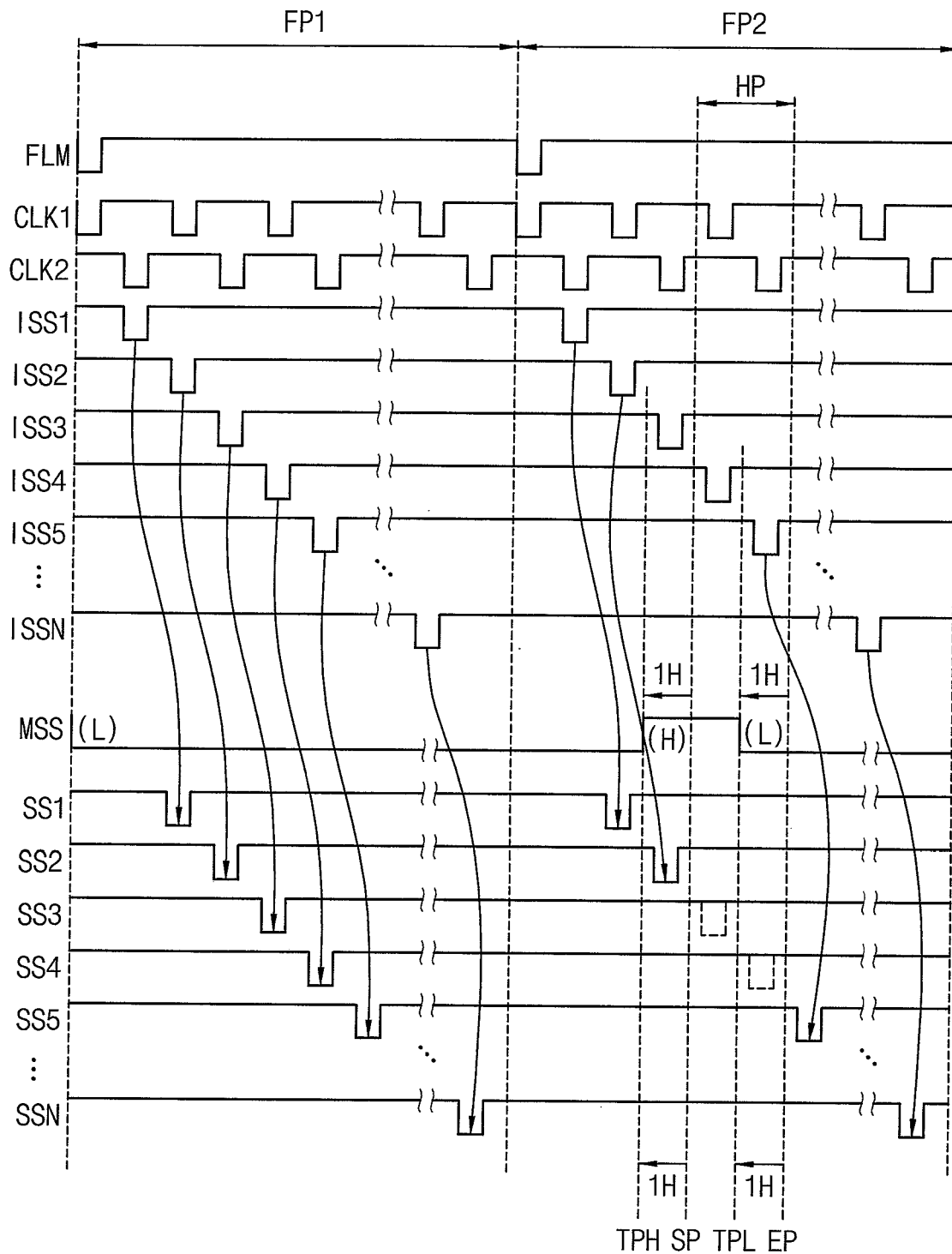
FIG. 4 is a timing diagram for describing an example of an operation of a scan driver according to some example embodiments.

FIG. 1 is a block diagram illustrating a scan driver according to some example embodiments, FIG. 2 is a circuit diagram illustrating an example of each first stage or each second stage included in a scan driver according to some example embodiments, FIG. 3 is a timing diagram for describing an example of an operation of a stage of FIG. 2, and FIG. 4 is a timing diagram for describing an example of an operation of a scan driver according to some example embodiments.

Referring to FIG. 1, a scan driver 100 according to some example embodiments may include a plurality of first stages 110, a plurality of masking transistors MST1 through MSTN, and a plurality of second stages 130.

The plurality of first stages 110 may receive a scan start signal FLM, and may sequentially output a plurality of intermediate scan signals ISS1 through ISSN based on the scan start signal FLM. A first one 111 of the first stages 110 may receive the scan start signal FLM as an input signal, and may output a first intermediate scan signal ISS1 based on the scan start signal FLM. In some example embodiments, the scan driver 100 include N first stages 111 through 117, and an input terminal of a K-th one of the N first stages 111 through 117 may be connected to an output terminal of a previous stage, or a (K−1)-th one of the N first stages 111 through 117, where N is an integer greater than 1, and K is an integer greater than 1 and less than or equal to N. Thus, the K-th one of the include the N first stages 111 through 117 may receive, as the input signal, a (K−1)-th intermediate scan signal from the (K−1)-th one of the N first stages 111 through 117, and may output a K-th intermediate scan signal based on the (K−1)-th intermediate scan signal. For example, a second one 112 of the N first stages 111 through 117 may output a second intermediate scan signal ISS2 based on the first intermediate scan signal ISS1, a third one 113 of the N first stages 111 through 117 may output a third intermediate scan signal ISS3 based on the second intermediate scan signal ISS2, a fourth one 114 of the N first stages 111 through 117 may output a fourth intermediate scan signal ISS4 based on the third intermediate scan signal ISS3, a fifth one 115 of the N first stages 111 through 117 may output a fifth intermediate scan signal ISS5 based on the fourth intermediate scan signal ISS4, and an N-th one 117 of the N first stages 111 through 117 may output an N-th intermediate scan signal ISSN based on an (N−1)-th intermediate scan signal ISSN-1.

The plurality of first stages 110 may further receive first and second clock signals CLK1-1 and CLK2-1 having different phases (e.g., opposite phases). In some example embodiments, odd-numbered stages 111, 113, 115, . . . from among the plurality of first stages 110 may receive the input signals in response to the first clock signal CLK1-1, and may output odd-numbered intermediate scan signals ISS1, ISS3, ISS5, . . . in response to the second clock signal CLK2-1. Further, even-numbered stages 112, 114, . . . from among the plurality of first stages 110 may receive the input signals in response to the second clock signal CLK2-1, and may output even-numbered intermediate scan signals ISS2, ISS4, . . . in response to the first clock signal CLK1-1.

In some example embodiments, each of the plurality of first stages 110 may have a structure of a stage 200 illustrated in FIG. 2. FIG. 2 illustrates an example where the stage 200 (e.g., the odd-numbered stages 111, 113, 115, . . . from among the plurality of first stages 110) receives an input signal SIN (e.g., the scan start signal FLM or the previous intermediate scan signal) in response to a first clock signal CLK1 (e.g., the first clock signal CLK1-1), and outputs an output signal SOUT (e.g., one of the plurality of intermediate scan signals ISS1 through ISSN) in response to a second clock signal CLK2 (e.g., the second clock signal CLK2-1). In some example embodiments, as illustrated in FIG. 2, each stage 200 may include an input circuit 210, a stress relaxing circuit 220, a bootstrap circuit 230, a scan output circuit 240, a holding circuit 250 and a stabilizing circuit 260.

The input circuit 210 may transfer the input signal SIN to a first node NQ' in response to the first clock signal CLK1. In some example embodiments, the stress relaxing circuit 220 may be located at a Q node, and thus the Q node may be divided by the stress relaxing circuit 220 into the first node NQ' and a second node NQ. The input circuit 210 may be connected to the first node NQ'. In some example embodiments, the input circuit 210 may include a first transistor T1 including a gate for receiving the first clock signal CLK1, a first terminal for receiving the input signal SIN, and a second terminal connected to the first node NQ'. Further, in some example embodiments, as illustrated in FIG. 2, the first transistor T1 may be implemented with, but not limited to, a dual transistor including two transistors connected in series.

The stress relaxing circuit 220 may be located between the first node NQ' and the second node NQ, and may transfer the input signal SIN from the first node NQ' to the second node NQ. By the input signal SIN transferred to the second node NQ, a voltage of the second node NQ may be changed to a first on level. In some example embodiments, the stress relaxing circuit 220 may include an eighth transistor T8 including a gate for receiving a gate on voltage VGL (e.g., a low gate voltage), a first terminal connected to the first node NQ', and a second terminal connected to the second node NQ. When the voltage of the second node NQ has a second on level having an absolute value greater than an absolute value of the first on level, the stress relaxing circuit 220, or the eighth transistor T8 may not transfer the voltage of the second node NQ having the second on level to the first node NQ', thereby reducing a voltage stress applied to transistors T1, T3 and T4 connected to the first node NQ'.

The bootstrap circuit 230 may change the voltage of the second node NQ from the first on level to the second on level by bootstrapping the second node NQ based on the second clock signal CLK2. In some example embodiments, the first on level may be a first low level, and the second on level may be a second low level lower than the first low level. Further, a voltage level difference between the first on level (e.g., the first low level) and the second on level (e.g., the second low level) may correspond to, but not limited to, a voltage level difference between an off level (e.g., a high level) and the first on level (e.g., the first low level). In some example embodiments, the bootstrap circuit 230 may include a first capacitor C1 including a first electrode connected to a scan output node NSO at which the output signal SOUT is output, and a second electrode connected to the second node NQ.

The scan output circuit 240 may output the second clock signal CK2 as the output signal SOUT in response to the voltage of the bootstrapped second node NQ, or the voltage of the second node NQ having the second on level. In some example embodiments, the scan output circuit 240 may include a sixth transistor T6 including a gate connected to a third node NQB, a first terminal for receiving a gate off voltage VGH (e.g., a high gate voltage), and a second terminal connected to the scan output node NSO, and a seventh transistor T7 including a gate connected to the second node NQ, a first terminal connected to the scan output node NSO, and a second terminal for receiving the second clock signal CLK2.

The holding circuit 250 may hold the third node NQB as the off level (e.g., the high level) while the output signal SOIT is output. In some example embodiments, the holding circuit 250 may include a fourth transistor T4 including a gate connected to the first node NQ', a first terminal connected to the third node NQB, and a second terminal for receiving the first clock signal CLK1.

After the output signal SOUT is output. the stabilizing circuit 260 may periodically apply the gate on voltage VGL to the third node NQB in response to the second clock signal CLK2, and may periodically apply the gate off voltage VGH to the first node NQ' in response to the first clock signal CLK1. The gate off voltage VGH applied to the first node NQ' may be transferred to the second node NQ by the eighth transistor T8, and thus the gate off voltage VGH may be periodically applied also to the second node NQ. In some example embodiments, the stabilizing circuit 260 may include a second transistor T2 including a gate connected to the third node NQB, a first terminal for receiving the gate off voltage VGH, and a second terminal, a third transistor T3 including a gate for receiving the second clock signal CLK2, a first terminal connected to the second terminal of the second transistor T2, and a second terminal connected to the first node NQ', a fifth transistor T5 including a gate for receiving the first clock signal CLK1, a first terminal connected to the third node NQB, and a second terminal for receiving the gate on voltage VGL, and a second capacitor C2 including a first electrode for receiving the gate off voltage VGL, and a second electrode connected to the third node NQB.

Hereinafter, an example of an operation of the stage 200 will be described below with reference to FIGS. 2 and 3.

Referring to FIGS. 2 and 3, each stage 200 may receive the input signal SIN, the first clock signal CLK1 and the second clock signal CLK2. In some example embodiments, as illustrated in FIG. 3, an on period of each of the first and second clock signals CLK1 and CLK2 may be shorter than an off period of each of the first and second clock signals CLK1 and CLK2. For example, each of the first and second clock signals CLK1 and CLK2 may have, but not limited to, a duty cycle ranging from about 20% to about 40%. In other example embodiments, the on period of each of the first and second clock signals CLK1 and CLK2 may be longer than or equal to the off period of each of the first and second clock signals CLK1 and CLK2. FIGS. 2 and 3 illustrate an example where the transistors T1 through T8 are PMOS transistors, the first one level is a first low level L, the second on level is a second low level 2L, the off level is a high level H, the gate on voltage is a low gate voltage VGL, and the gate off voltage is a high gate voltage VGH.

In a period from a first time point TP1 to a second time point TP2, the input signal SIN having the first low level L may be applied, and the first clock signal CLK1 having the first low level L may be applied. The first transistor T1 may transfer the input signal SIN to the first node NQ', and thus the voltage V_NQ' of the first node NQ' may be changed from the high level H to the first low level L. Further, the eighth transistor T8 may transfer the input signal SIN from the first node NQ' to the second node NQ in response to the low gate voltage VGL having the first low level L, and thus the voltage V_NQ of the second node NQ may be changed from the high level H to the first low level L.

The first clock signal CLK1 may be changed from the first low level L to the high level H at the second time point TP2, and the first clock signal CLK1 having the high level H may be applied in a period from the second time point TP2 to a third time point TP3. The fourth transistor T4 may transfer the first clock signal CLK1 having the high level H to the third node NQB in response to the voltage V_NQ' of the first node NQ' having the first low level, and a voltage V_NQB of the third node NQB may be changed from the first low level L to the high level H.

The second clock signal CLK2 may be changed from the high level H to the first low level L at the third time point TP3, and the second clock signal CLK2 having the first low level L may be applied in a period from the third time point TP3 to a fourth time point TP4. The seventh transistor T7 may transfer the second clock signal CLK2 having the first low level L to the scan output node NSO in response to the voltage V_NQ of the second node NQ, and the second clock signal CLK2 may be output as the output signal SOUT at the scan output node NSO. In this case, a voltage of the scan output node NSO, or a voltage of the first electrode of the first capacitor C1 may be changed from the high level H to the first low level L, and thus a voltage of the second electrode of the first capacitor C1, or the voltage V_NQ of the second node NQ may be changed from the first low level L to the second low level 2L lower than the first low level L. In some example embodiments, a voltage level difference between the first low level L and the second low level 2L may correspond to, but not limited to, a voltage level difference between the high level H and the first low level L. Here, an operation that changes the voltage V_NQ of the second node NQ from the first low level L to the second low level 2L may be referred to as a bootstrap operation, and the first capacitor C1 may be referred to as a bootstrap capacitor. The eighth transistor T8 may not transfer the voltage V_NQ of the second node NQ having the second low level 2L to the first node NQ', thereby reducing the voltage stress applied to the transistors T1, T3 and T4 connected to the first node NQ'. Thus, the eighth transistor T8 may be referred to as a stress relaxing (or relieving) transistor. While the output signal SOUT is output, the fourth transistor T4 having a gate for receiving the voltage V_NQ' of the first node NQ' having the first low level L may be turned on, and the voltage V_NQB of the third node NQB may be held or maintained as the high level H by the turned-on fourth transistor T4. While the output signal SOUT is output, the sixth transistor T6 may not be turned on based on the voltage V_NQB of the third node NQB having the high level H.

If the second clock signal CLK2 is changed to the high level H at the fourth time point TP4, the output signal SOUT at the scan output node NSO may be changed to the high level H. If the voltage of the scan output node NSO, or the voltage of the first electrode of the first capacitor C1 is changed from the first low level L to the high level H, the voltage of the second electrode of the first capacitor C1, or the voltage V_NQ of the second node NQ may be changed from the second low level 2L to the first low level L.

The first clock signal CLK1 may be changed from the high level H to the first low level L at a fifth time point TP5, and the first clock signal CLK1 having the first low level L may be applied in a period from the fifth time point TP5 to a sixth time point TP6. The first transistor T1 may change the voltage V_NQ' of the first node NQ' from the first low level L to the high level H in response to the first clock signal CLK1 having the first low level L, and the eighth transistor T8 may change the voltage V_NQ of the second node NQ from the first low level L to the high level H in response to the low gate voltage VGL. The fifth transistor T5 may change the voltage V_NQB of the third node NQB from the high level H to the first low level L in response to the first clock signal CLK1 having the first low level L. The fifth transistor T5 may be turned on each time the first clock signal CLK1 has the first low level L, and thus the low gate voltage VGL may be periodically applied to the third node NQB. The sixth transistor T6 may apply the high gate voltage VGH to the scan output node NSO in response to the voltage V_NQB of the third node NQB having the first low level L.

The second clock signal CLK2 may be changed from the high level H to the first low level L at a seventh time point TP7, and the second clock signal CLK2 having the first low level L may be applied in a period from the seventh time point TP7 to an eighth time point TP8. The second transistor T2 may be turned on in response to the voltage V_NQB of the second node NQB having the first low level L, the third transistor T3 may be turned on in response to the second clock signal CLK2 having the first low level L, the high gate voltage VGH may be applied to the first node NQ' by the turned-on second and third transistors T2 and T3, and thus the voltage V_NQ' of the first node NQ' may be stabilized to the high level H. Further, by the eighth transistor T8 turned on in response to the gate on voltage VGL having the first low level L, the voltage V_NQ of the second node NQ also may be stabilized to the high level H. The third transistor T3 may be turned on each time the second clock signal CLK2 has the first low level L, and thus the high gate voltage VGH may be periodically applied to the first and second nodes NQ' and NQ.

In this manner, the stage 200 (e.g., the odd-numbered stages 111, 113, 115, . . . ) may receive the input signal SIN in response to the first clock signal CLK1, and may output the output signal SOUT in response to the second clock signal CLK2.

Referring again to FIG. 1, the plurality of masking transistors MST1 through MSTN may be respectively connected to a plurality of output terminals of the plurality of first stages 110, and may selectively transfer the plurality of intermediate scan signals ISS1 through ISSN in response to a masking signal MSS, respectively. For example, a first masking transistor MST1 may selectively transfer the first intermediate scan signal ISS1 output from the first one 111 of the first stages 110 to a first one 131 of the second stages 130 in response to the masking signal MSS, a second masking transistor MST2 may selectively transfer the second intermediate scan signal ISS2 output from the second one 112 of the first stages 110 to a second one 132 of the second stages 130 in response to the masking signal MSS, and an N-th masking transistor MSTN may selectively transfer the N-th intermediate scan signal ISSN output from the N-th one 117 of the first stages 110 to an N-th one 137 of the second stages 130 in response to the masking signal MSS.

Further, each of the plurality of masking transistors MST1 through MSTN may not transfer a corresponding one of the plurality of intermediate scan signals ISS1 through ISSN in response to the masking signal MSS having the off level (e.g., the high level), and may transfer the corresponding one of the plurality of intermediate scan signals ISS1 through ISSN to a corresponding one of the plurality of second stages 130 in response to the masking signal MSS having the on level (e.g., the low level). In some example embodiments, as illustrated in FIG. 1, each of the plurality of masking transistors MST1 through MSTN may include a gate for receiving the masking signal MSS, a first terminal connected to an output terminal of a corresponding one of the plurality of first stages 110, and a second terminal connected to an input terminal of a corresponding one of the plurality of second stages 130.

A plurality of input terminals of the plurality of second stages 130 may be respectively connected to the plurality of masking transistors MST1 through MSTN, and the plurality of second stages 130 may selectively output a plurality of scan signals SS1 through SSN based on the plurality of intermediate scan signals ISS1 through ISSN selectively transferred by the plurality of masking transistors MST1 through MSTN. In some example embodiments, the scan driver 100 include N second stages 131 through 137, and an input terminal of an M-th one of the N second stages 131 through 137 may be connected to an M-th masking transistor of the plurality of masking transistors MST1 through MSTN, where M is an integer greater than 0 and less than or equal to N. Thus, the M-th one of the N second stages 131 through 137 may selectively output an M-th scan signal based on an M-th intermediate scan signal selectively transferred by the M-th masking transistor.

For example, a first one 131 of the N second stages 131 through 137 may selectively output a first scan signal SS1 based on the first intermediate scan signal ISS1 selectively transferred by the first masking transistor MST1, a second one 132 of the N second stages 131 through 137 may selectively output a second scan signal SS2 based on the second intermediate scan signal ISS2 selectively transferred by the second masking transistor MST2, a third one 133 of the N second stages 131 through 137 may selectively output a third scan signal SS3 based on the third intermediate scan signal ISS3 selectively transferred by the third masking transistor MST3, a fourth one 134 of the N second stages 131 through 137 may selectively output a fourth scan signal SS4 based on the fourth intermediate scan signal ISS4 selectively transferred by the fourth masking transistor MST4, a fifth one 131 of the N second stages 131 through 137 may selectively output a fifth scan signal SS5 based on the fifth intermediate scan signal ISS5 selectively transferred by the fifth masking transistor MST5, and an N-th one 137 of the N second stages 131 through 137 may selectively output an N-th scan signal SSN based on the N-th intermediate scan signal ISSN selectively transferred by the N-th masking transistor MSTN.

The plurality of second stages 130 may further receive first and second clock signals CLK1-2 and CLK2-2 having different phases (e.g., opposite phases). In some example embodiments, odd-numbered stages 131, 133, 135, . . . from among the plurality of second stages 130 may receive the odd-numbered intermediate scan signals ISS1, ISS3, ISS5, . . . in response to the second clock signal CLK2-2, and may output odd-numbered scan signals SS1, SS3, SS5, . . . in response to the first clock signal CLK1-2. Further, even-numbered stages 132, 134, . . . from among the plurality of second stages 130 may receive the even-numbered intermediate scan signals ISS2, ISS4, . . . in response to the first clock signal CLK1-2, and may output odd-even scan signals SS2, SS4, . . . in response to the second clock signal CLK2-2.

Further, in some example embodiments, the first clock signal CLK1-2 applied to the plurality of second stages 130 may have substantially the same phase and/or pulse width as the first clock signal CLK1-1 applied to the plurality of first stages 110, and the second clock signal CLK2-2 applied to the plurality of second stages 130 may have substantially the same phase and/or pulse width as the second clock signal CLK2-1 applied to the plurality of first stages 110. In other example embodiments, the first and second clock signals CLK1-2 and CLK2-2 applied to the plurality of second stages 130 may have pulse widths greater than those of the first and second clock signals CLK1-1 and CLK2-1 applied to the plurality of first stages 110.

In some example embodiments, each of the plurality of second stages 130 may have a structure substantially the same as a structure of each of the plurality of first stages 110. For example, similarly to each of the plurality of first stages 110, each of the plurality of second stages 130 may have the structure of the stage 200 illustrated in FIG. 2. FIG. 2 illustrates an example where the stage 200 (e.g., the even-numbered stages 132, 134, . . . from among the plurality of second stages 130) receives the input signal SIN (e.g., a corresponding intermediate scan signal) in response to the first clock signal CLK1 (e.g., the first clock signal CLK1-2), and outputs the output signal SOUT (e.g., a corresponding scan signal) in response to the second clock signal CLK2 (e.g., the second clock signal CLK2-2). For example, each of the plurality of second stages 130 may include the input circuit 210, the stress relaxing circuit 220, the bootstrap circuit 230, the scan output circuit 240, the holding circuit 250 and the stabilizing circuit 260. Further, in some example embodiments, each of the plurality of second stages 130 may operate with timing illustrated in FIG. 3. For example, the stage 200 (e.g., the even-numbered stages 132, 134, . . . ) may receive the input signal SIN in response to the first clock signal CLK1, and may output the output signal SOUT in response to the second clock signal CLK2.

The plurality of scan signals SS1 through SSN selectively generated by the plurality of second stages 130 may be provided to a plurality of pixels included in a display device including the scan driver 100. In some example embodiments, the plurality of intermediate scan signals ISS1 through ISSN generated by the plurality of first stages 110 may be selectively provided to the plurality of second stages 130 through the plurality of masking transistors MST1 through MSTN, and may not be provided to the outside of the scan driver 100. In other example embodiments, the plurality of intermediate scan signals ISS1 through ISSN generated by the plurality of first stages 110 may be provided as a plurality of initialization signals to the plurality of pixels. In this case, the plurality of intermediate scan signals ISS1 through ISSN may be used as the plurality of initialization signals.

The display device including the scan driver 100 according to some example embodiments may perform multi-frequency driving (MFD) that drives a plurality of panel regions each including at least one pixel row at a plurality of driving frequencies. In some example embodiments, from among the plurality of panel regions, a panel region displaying a moving image may be driven a normal driving frequency (e.g., about 60 Hz or about 120 Hz), and a panel region displaying a still image may be driven a low frequency lower than the normal driving frequency. In this case, in at least one frame period from among a plurality of consecutive frame periods, a portion of the frame period corresponding to the panel region driven at the low frequency may be set as a hold period in which the panel is not driven (e.g., in which data signals and/or scan signals may not be applied to the plurality of pixels of the panel region). For example, in a case where a first panel region is driven at the normal driving frequency of about 60 Hz, and a second panel region is driven at the low frequency of about 30 Hz, from among two frame periods, a portion of one frame period corresponding to the second panel region may be set as the hold period.

In a case where at least one frame period from among a plurality of consecutive frame periods includes the hold period, the plurality of first stages 110 may sequentially output all of the plurality of intermediate scan signals ISS1 through ISSN in each of the plurality of consecutive frame periods. However, the plurality of second stages 130 may sequentially output all of the plurality of scan signals SS1 through SSN in each frame period not including the hold period, and may output only a portion of the plurality of scan signals SS1 through SSN in each frame period including the hold period. For example, as illustrated in FIG. 4, in a case where a first panel region including first and second pixel rows to which first and second scan signals SS1 and SS2 are applied is driven at the normal driving frequency of about 60 Hz, a second panel region including third and fourth pixel rows to which third and fourth scan signals SS3 and SS4 are applied is driven at the low frequency of about 30 Hz, and a third panel region including fifth through N-th pixel rows to which fifth through N-th scan signals SS5, SSN are applied is driven at the normal driving frequency of about 60 Hz, from among first and second frame periods FP1 and FP2, a portion of the second frame period FP2 may be set as the hold period HP.

In the first frame period FP1, the plurality of first stages 110 may sequentially output the plurality of intermediate scan signals ISS1 through ISSN based on the scan start signal FLM. The masking signal MSS may have the on level, or the low level L in the first frame period FP1, and the plurality of masking transistors MST1 through MSTN may respectively transfer the plurality of intermediate scan signals ISS1 through ISSN to the plurality of second stages 130 in response to the masking signal MSS having the low level L. Accordingly, in the first frame period FP1, the plurality of second stages 130 may respectively output the plurality of scan signals SS1 through SSN based on the plurality of intermediate scan signals ISS1 through ISSN transferred by the plurality of masking transistors MST1 through MSTN.

In some example embodiments, since each of the plurality of second stages 130 receives a corresponding one of the plurality of intermediate scan signals ISS1 through ISSN in response to one of the first and second clock signals CLK1 and CLK2, and outputs a corresponding one of the plurality of scan signals SS1 through SSN in response to the other of the first and second clock signals CLK1 and CLK2, each of the plurality of scan signals SS1 through SSN output from the plurality of second stages 130 may be delayed by one horizontal time 1H with respect to a corresponding one of the plurality of intermediate scan signals ISS1 through ISSN output from the plurality of first stages 110.

For example, as illustrated in FIG. 4, the first one 131 of the second stages 130 may output the first scan signal SS1 that is delayed by one horizontal time 1H from the first intermediate scan signal ISS1, the second one 132 of the second stages 130 may output the second scan signal SS2 that is delayed by one horizontal time 1H from the second intermediate scan signal ISS2, the third one 133 of the second stages 130 may output the third scan signal SS3 that is delayed by one horizontal time 1H from the third intermediate scan signal ISS3, the fourth one 134 of the second stages 130 may output the fourth scan signal SS4 that is delayed by one horizontal time 1H from the fourth intermediate scan signal ISS4, the fifth one 135 of the second stages 130 may output the fifth scan signal SS5 that is delayed by one horizontal time 1H from the fifth intermediate scan signal ISS5, and the N-th one 137 of the second stages 130 may output the N-th scan signal SSN that is delayed by one horizontal time 1H from the N-th intermediate scan signal ISSN.

In the second frame period FP2, the plurality of first stages 110 may sequentially output the plurality of intermediate scan signals ISS1 through ISSN based on the scan start signal FLM. In some example embodiments, the masking signal MSS may be changed to the off level, or the high level H at a time point TPH before one horizontal time 1H from a start time point SP of the hold period HP, and may be changed to the on level, or the low level L at a time point TPL before one horizontal time 1H from an end time point EP of the hold period HP.

For example, as illustrated in FIG. 4, in a case where a portion of the second frame period FP2 in which the third and fourth scan signals SS3 and SS4 is set as the hold period HP, the time point TPH before one horizontal time 1H from the start time point SP of the hold period HP, or the time point TPH at which the masking signal MSS is changed to the high level H may be after the second intermediate scan signal ISS2 is output and before the third intermediate scan signal ISS3 is output, and the time point TPL before one horizontal time 1H from the end time point EP of the hold period HP, or the time point TPL at which the masking signal MSS is changed to the low level L may be after the fourth intermediate scan signal ISS4 is output and before the fifth intermediate scan signal ISS5 is output.

Thus, in response to this masking signal MSS, the first and second masking transistors MST1 and MST2 may transfer the first and second intermediate scan signals ISS1 and ISS2 to the first and second ones 131 and 132 of the second stages 130, the third and fourth masking transistors MST3 and MST4 may not transfer the third and fourth intermediate scan signals ISS3 and ISS4, and the fifth through N-th masking transistors MST5, MSTN may transfer the fifth through N-th intermediate scan signals ISS5, . . . , ISSN to the fifth through N-th ones 135, . . . , 137 of the second stages 130. Accordingly, in the second frame period FP2, the first and second ones 131 and 132 of the second stages 130 may output the first and second scan signals SS1 and SS2, the third and fourth ones 133 and 134 of the second stages 130 may not output the third and fourth scan signals SS3 and SS4, and the fifth through N-th ones 135, . . . , 137 of the second stages 130 may output the fifth through N-th scan signals SS5, . . . , SSN.

As described above, in the scan driver 100 according to some example embodiments, the plurality of first stages 110 may sequentially output the plurality of intermediate scan signals ISS1 through ISSN, the plurality of masking transistors MST1 through MSTN may selectively transfer the plurality of intermediate scan signals ISS1 through ISSN in response to the masking signal MSS, respectively, and the plurality of second stages 130 may selectively output the plurality of scan signals SS1 through SSN based on the plurality of intermediate scan signals ISS1 through ISSN selectively transferred by the plurality of masking transistors MST1 through MSTN. Accordingly, the scan driver 100 according to some example embodiments may provide the plurality of scan signals SS1 through SSN at the different driving frequencies to the plurality of panel regions.

Figure 5:
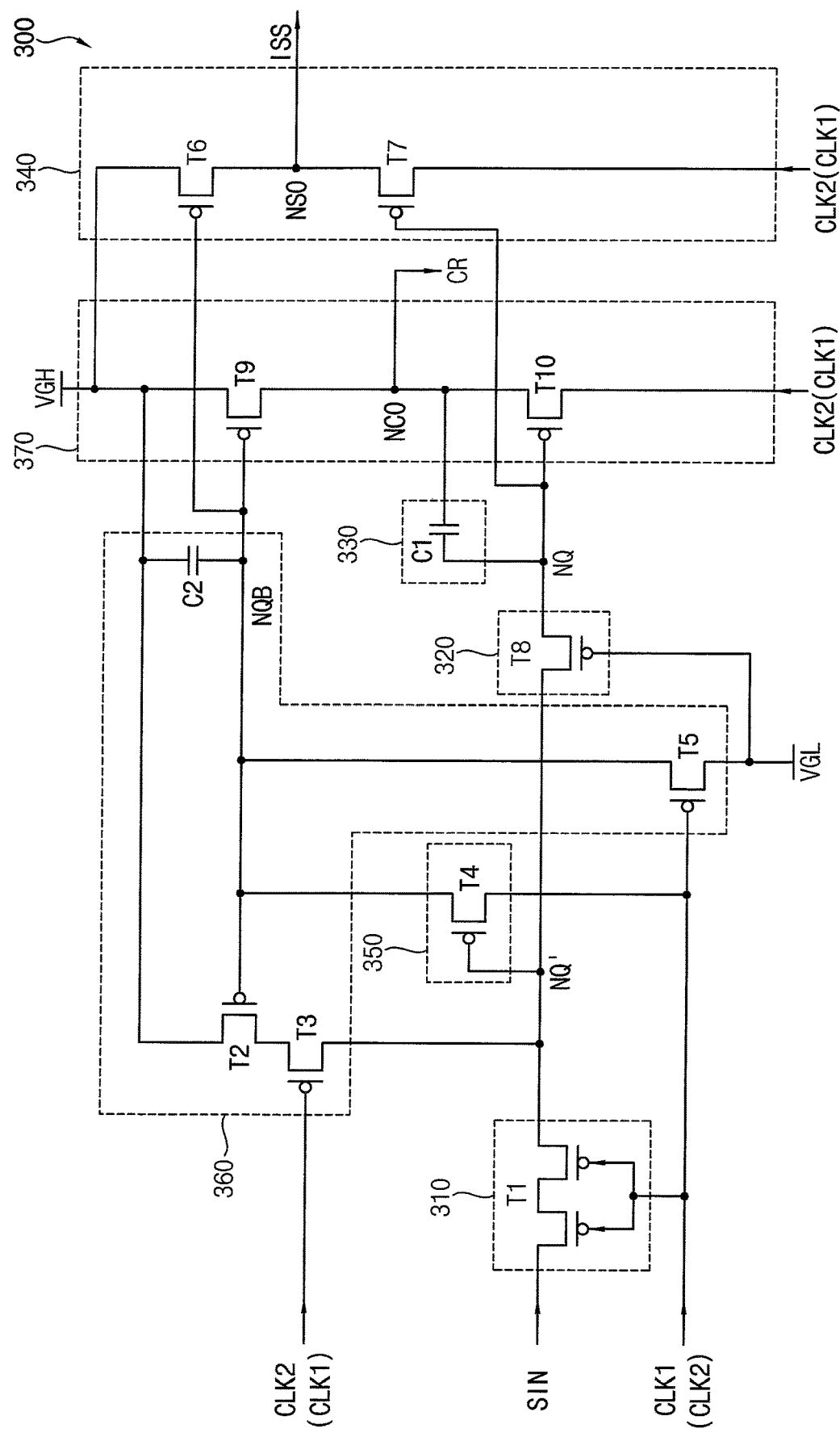
FIG. 5 is a circuit diagram illustrating another example of each first stage included in a scan driver according to some example embodiments.

FIG. 5 is a circuit diagram illustrating another example of each first stage included in a scan driver according to some example embodiments.

Referring to FIGS. 1, 2 and 5, in some example embodiments, each of a plurality of second stages 130 may have a structure of a stage 200 illustrated in FIG. 2, and each of a plurality of first stages 110 may have a structure of a stage 300 illustrated in FIG. 5. Thus, compared with each of the plurality of second stages 130, or the stage 200 illustrated in FIG. 2, each of the plurality of first stages 110, or the stage 300 illustrated in FIG. 5 may further include a carry output circuit 370.

As illustrated in FIG. 5, each stage 300 may include an input circuit 310, a stress relaxing circuit 320, a bootstrap circuit 330, a scan output circuit 340, a holding circuit 350, a stabilizing circuit 360 and the carry output circuit 370. The input circuit 310, the stress relaxing circuit 320, the bootstrap circuit 330, the scan output circuit 340, the holding circuit 350 and the stabilizing circuit 360 illustrated in FIG. 5 may be substantially the same as an input circuit 210, a stress relaxing circuit 220, a bootstrap circuit 230, a scan output circuit 240, a holding circuit 250 and a stabilizing circuit 260 illustrated in FIG. 2.

The scan output circuit 340 may output an intermediate scan signal ISS in response to a voltage of a bootstrapped second node NQ, and the carry output circuit 370 may output a carry signal CR that is applied as an input signal SIN to a next stage in response to the voltage of the bootstrapped second node NQ. In some example embodiments, the carry output circuit 370 may include a ninth transistor T9 including a gate connected to a third node NQB, a first terminal for receiving a gate off voltage VGH, and a second terminal connected to a carry output node NCO at which the carry signal CR is output, and a tenth transistor T10 including a gate connected to the second node NQ, a first terminal connected to the carry output node NCO, and a second terminal for receiving a second clock signal CLK2. Although FIG. 5 illustrates an example where the bootstrap circuit 330, or a first electrode of a first capacitor C1 is connected to the carry output node NCO, in some example embodiments, the first electrode of the first capacitor C1 may be connected to a scan output node NSO.

In a case where each of the plurality of first stages 110 has the structure of the stage 300 illustrated in FIG. 5, the plurality of first stages 110 may selectively provide a plurality of intermediate scan signals ISS1 through ISSN to the plurality of second stages 130 through a plurality of masking transistors MST1 through MSTN, and may provide the carry signals CR as the input signals SIN to the next first stages 110. Thus, a first one 111 of the first stages 110 may output a first intermediate scan signal ISS1 based on a scan start signal FLM. and a K-th one of the first stages 110 may output a K-th intermediate scan signal based on the previous carry signal CS output from a (K−1)-th one of the first stages 110, where K is an integer greater than 1.

For example, a second one 112 of the first stages 110 may output a second intermediate scan signal ISS2 based on the carry signal CR output from the first one 111 of the first stages 110, a third one 113 of the first stages 110 may output a third intermediate scan signal ISS3 based on the carry signal CR output from the second one 112 of the first stages 110, a fourth one 114 of the first stages 110 may output a fourth intermediate scan signal ISS4 based on the carry signal CR output from the third one 113 of the first stages 110, a fifth one 115 of the first stages 110 may output a fifth intermediate scan signal ISS5 based on the carry signal CR output from the fourth one 114 of the first stages 110, and an N-th one 117 of the first stages 110 may output an N-th intermediate scan signal ISSN based on the carry signal CR output from an (N−1)-th one of the first stages 110. A K-th one of the plurality of second stages 130 may selectively output a K-th one of a plurality of scan signals SS1 through SSN based on the K-th intermediate scan signal selectively transferred by a K-th masking transistor. Accordingly, a scan driver 100 according to some example embodiments may provide the plurality of scan signals SS1 through SSN at different driving frequencies to a plurality of panel regions.

Figure 6:
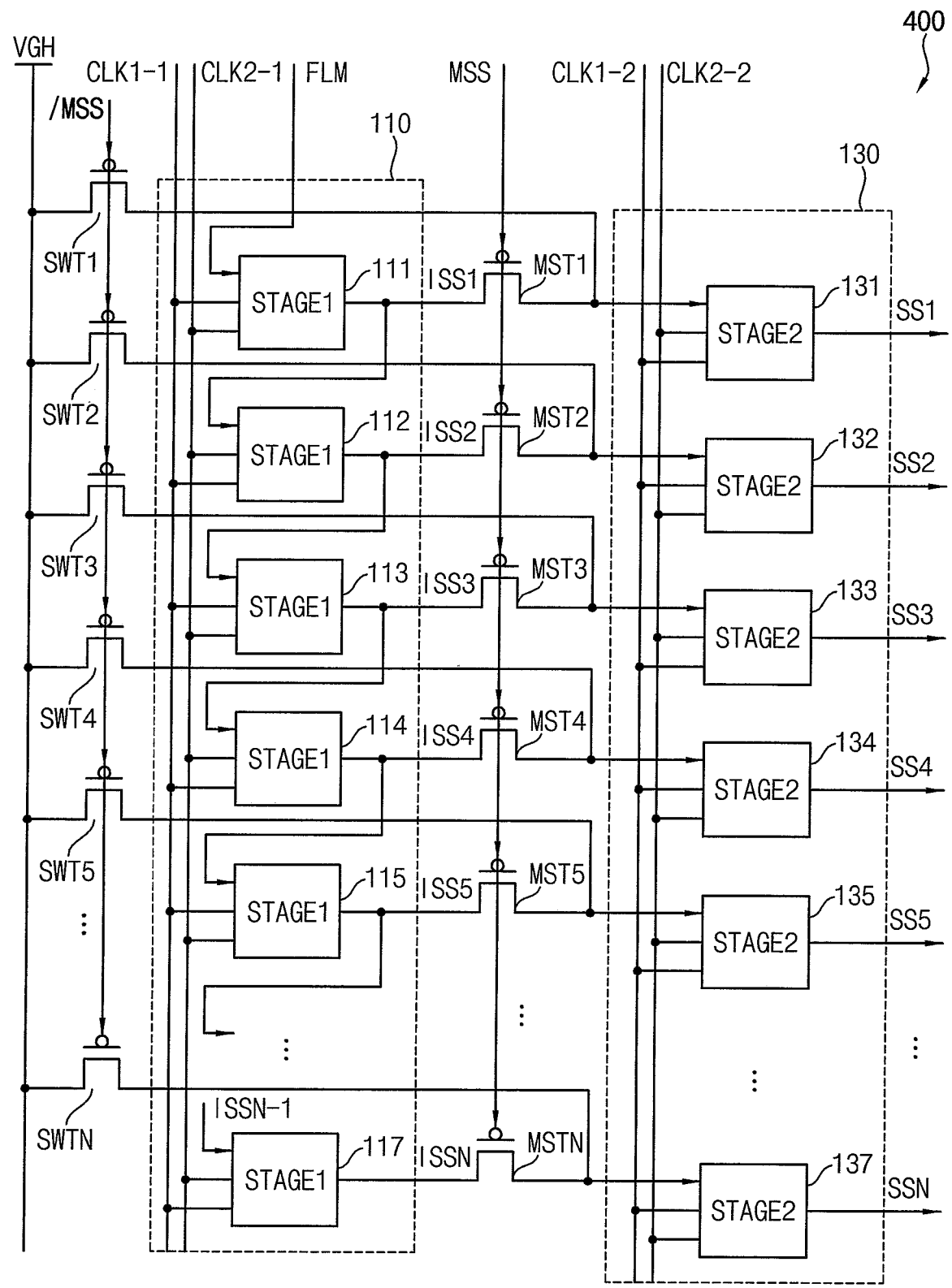
FIG. 6 is a block diagram illustrating a scan driver according to some example embodiments.

FIG. 6 is a block diagram illustrating a scan driver according to some example embodiments.

Referring to FIG. 6, a scan driver 400 according to some example embodiments may include a plurality of first stages 110, a plurality of masking transistors MST1 through MSTN, a plurality of second stages 130, and a plurality of switching transistors SWT1 through SWTN. The scan driver 400 of FIG. 6 may have a configuration and an operation substantially the same as those of a scan driver 100 of FIG. 1, except that the scan driver 400 of FIG. 6 may further include the plurality of switching transistors SWT1 through SWTN.

The plurality of switching transistors SWT1 through SWTN may transfer a gate off voltage VGH (e.g., a high gate voltage) to a plurality of input terminals of the plurality of second stages 130 in response to an inverted masking signal /MSS that is an inversion signal of a masking signal MSS. In some example embodiments, each of the plurality of switching transistors SWT1 through SWTN may include a gate for receiving the inverted masking signal /MSS, a first terminal for receiving the gate off voltage VGH, and a second terminal connected to a corresponding one of the plurality of input terminals of the plurality of second stages 130.

When the masking signal MSS has an on level, and the inverted masking signal /MSS has an off level, a plurality of intermediate scan signals ISS1 through ISSN may be transferred through the plurality of masking transistors MST1 through MSTN to the input terminals of the plurality of second stages 130. Alternatively, when the masking signal MSS has the off level, and the inverted masking signal /MSS has the on level, the gate off voltage VGH may be transferred through the plurality of switching transistors SWT1 through SWTN to the input terminals of the plurality of second stages 130. Accordingly, while the plurality of masking transistors MST1 through MSTN is turned off, instances of the input terminals of the plurality of second stages 130 being floated may be prevented or reduced.

As described above, in the scan driver 400 according to some example embodiments, the plurality of first stages 110 may sequentially output the plurality of intermediate scan signals ISS1 through ISSN, the plurality of masking transistors MST1 through MSTN may selectively transfer the plurality of intermediate scan signals ISS1 through ISSN in response to the masking signal MSS, respectively, and the plurality of second stages 130 may selectively output a plurality of scan signals SS1 through SSN based on the plurality of intermediate scan signals ISS1 through ISSN selectively transferred by the plurality of masking transistors MST1 through MSTN. Accordingly, the scan driver 400 according to some example embodiments may provide the plurality of scan signals SS1 through SSN at different driving frequencies to a plurality of panel regions. Further, in the scan driver 400 according to some example embodiments, the plurality of switching transistors SWT1 through SWTN may prevent or reduce instances of the input terminals of the plurality of second stages 130 being floated.

Figure 7:
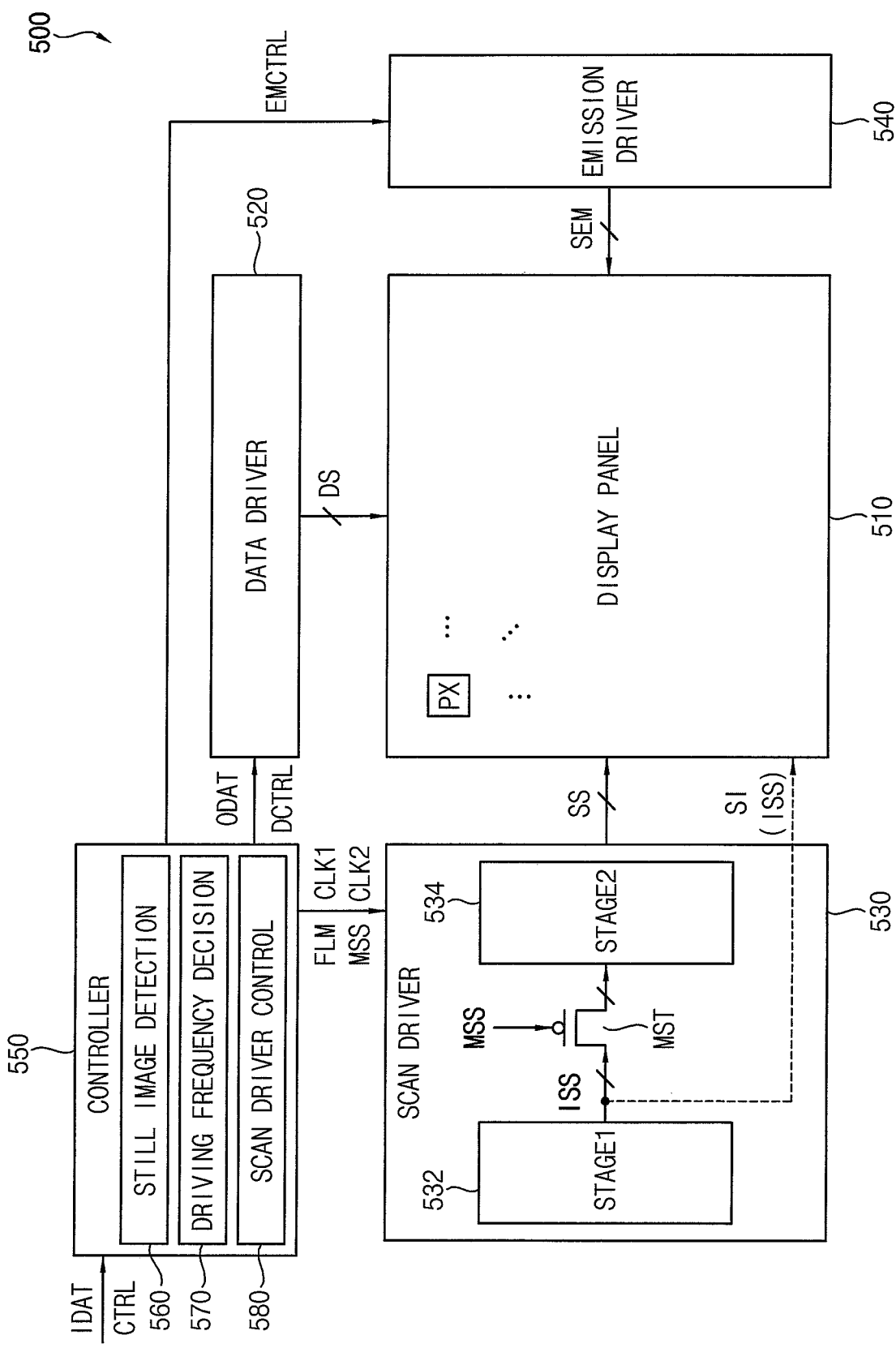
FIG. 7 is a block diagram illustrating a display device including a scan driver according to some example embodiments.
Figure 8:
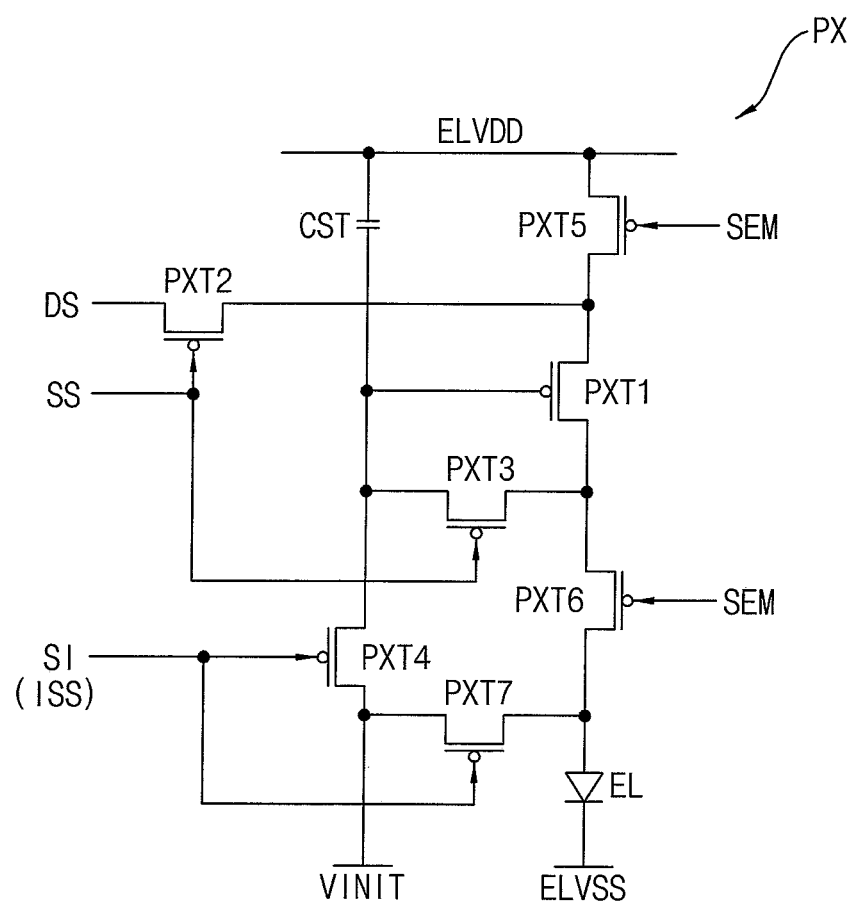
FIG. 8 is a circuit diagram illustrating an example of a pixel included in a display device according to some example embodiments.
Figure 9:
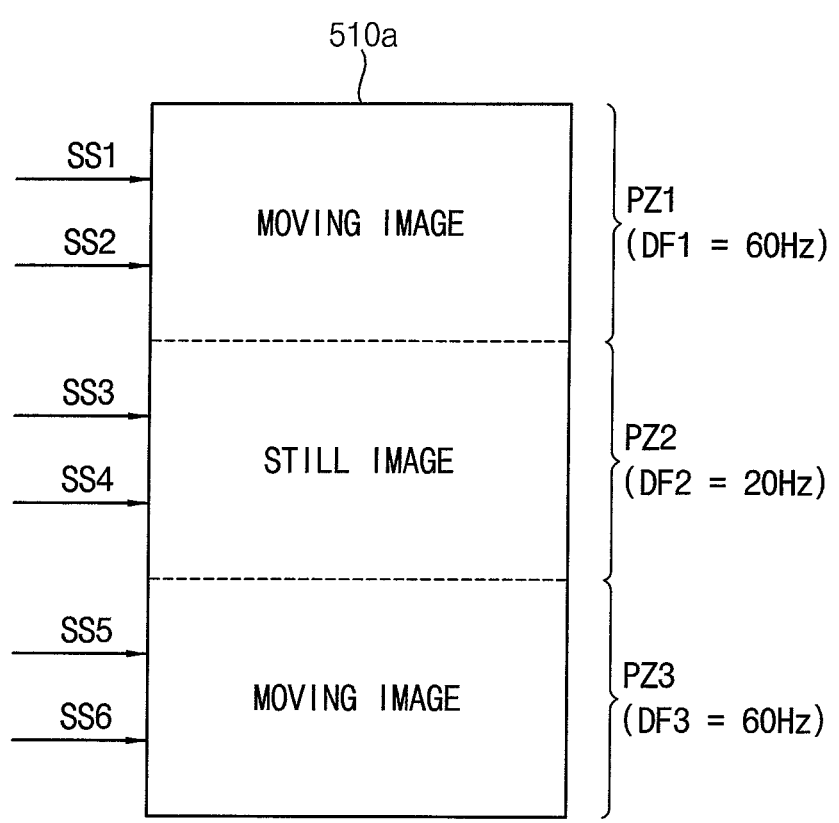
FIG. 9 is a diagram illustrating an example of a display panel including a plurality of panel regions driven at different driving frequencies in a display device according to some example embodiments.
Figure 10:
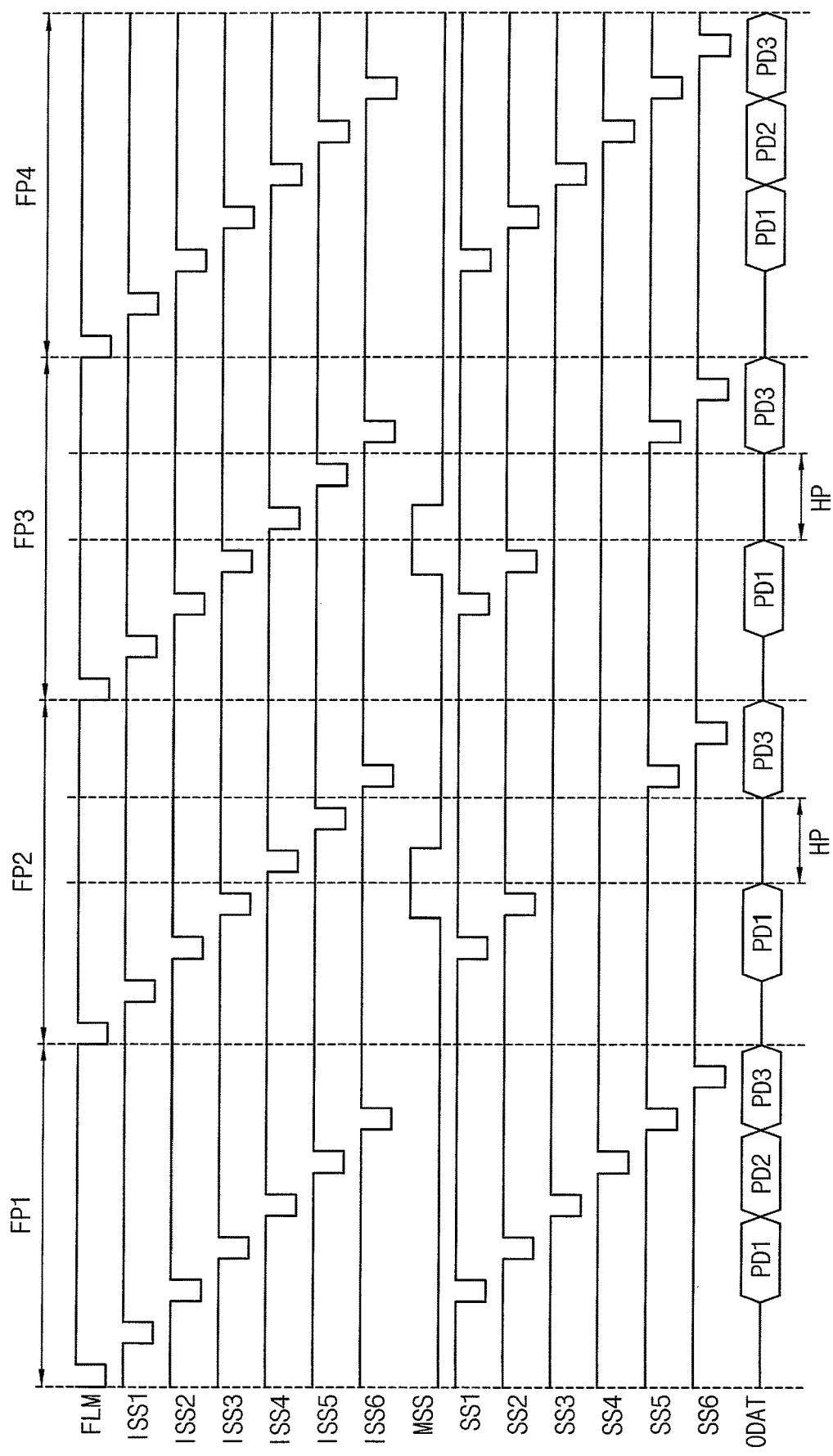
FIG. 10 is a timing diagram for describing an example of an operation of a scan driver that provides scan signals to a display panel of FIG. 9.

FIG. 7 is a block diagram illustrating a display device including a scan driver according to some example embodiments, FIG. 8 is a circuit diagram illustrating an example of a pixel included in a display device according to some example embodiments, FIG. 9 is a diagram illustrating an example of a display panel including a plurality of panel regions driven at different driving frequencies in a display device according to some example embodiments, and FIG. 10 is a timing diagram for describing an example of an operation of a scan driver that provides scan signals to a display panel of FIG. 9.

Referring to FIG. 7, a display device 500 according to some example embodiments may include a display panel 510 including a plurality of pixel rows, a data driver 520 providing data signals DS to each of the plurality of pixel rows, a scan driver 530 providing a plurality of scan signals SS to the plurality of pixel rows, respectively, and a controller 550 controlling the data driver 520 and the scan driver 530. In some example embodiments, the display device 500 may further include an emission driver 540 providing emission signals SEM to the plurality of pixel rows.

The display panel 510 may include a plurality of scan lines, a plurality of data lines, and the plurality of pixel rows respectively connected to the plurality of scan lines. Here, each pixel row may mean one row of pixels PX connected to a single scan line. In some example embodiments, each pixel PX may include at least one capacitor, at least two transistors and an organic light emitting diode (OLED), and the display panel 510 may be an OLED display panel.

For example, as illustrated in FIG. 8, each pixel PX may include a driving transistor PXT1 that generates a driving current, a switching transistor PXT2 that transfers the data signal DS from the data driver 520 to a source of the driving transistor PXT1 in response to the scan signal SS from the scan driver 530, a compensating transistor PXT3 that diode-connects the driving transistor PXT1 in response to the scan signal SS from the scan driver 530, a storage capacitor CST that stores the data signal DS transferred through the switching transistor PXT2 and the diode-connected driving transistor PXT1, a first initializing transistor PXT4 that provides an initialization voltage VINIT to the storage capacitor CST and a gate of the driving transistor PXT1 in response to an initialization signal SI (or an intermediate scan signal ISS) from the scan driver 530, a first emission transistor PXT5 that connects a line of a first power supply voltage ELVDD to the source of the driving transistor PXT1 in response to the emission signal SEM from the emission driver 540, a second emission transistor PXT6 that connects a drain of the driving transistor PXT1 to an organic light emitting diode EL in response to the emission signal SEM from the emission driver 540, a second initializing transistor PXT7 that provides the initialization voltage VINIT to the organic light emitting diode EL in response to the initialization signal SI (or the intermediate scan signal ISS) from the scan driver 530, and the organic light emitting diode EL that emits light based on the driving current from the line of the first power supply voltage ELVDD to a line of a second power supply voltage ELVSS.

In some example embodiments, each pixel PX may include PMOS transistors PXT1 through PXT7 as illustrated in FIG. 8. In other example embodiments, each pixel PX may include NMOS transistors. In still other example embodiments, each pixel PX may include different types of transistors suitable for low frequency driving capable of reducing power consumption. For example, each pixel PX may include at least one low-temperature polycrystalline silicon (LTPS) PMOS transistor, and at least one oxide NMOS transistor. For example, the compensating transistor PXT3 and the first initializing transistor PXT4 may be implemented with the NMOS transistors, and other transistors PXT1, PXT2, PXT5, PXT6 and PXT7 may be implemented with the PMOS transistors. In this case, because the transistors PXT3 and PXT4 directly connected to the storage capacitor CST are implemented with the NMOS transistors, a leakage current from the storage capacitor CST may be reduced, and thus the pixel PX may be suitable for the low frequency driving. In other example embodiments, the display panel 510 may be a liquid crystal display (LCD) panel, or the like.

The data driver 520 may generate the data signals DS based on output image data ODAT and a data control signal DCTRL received from the controller 550, and may provide the data signals DS to each of the plurality of pixel rows through the plurality of data lines. In some example embodiments, the data control signal DCTRL may include, but not limited to, an output data enable signal, a horizontal start signal and a load signal. In some example embodiments, the data driver 520 and the controller 550 may be implemented with a single integrated circuit, and the single integrated circuit may be referred to as a timing controller embedded data driver (TED). In other example embodiments, the data driver 520 and the controller 550 may be implemented with separate integrated circuits.

The scan driver 530 may generate the plurality scan signals SS based on a scan control signal received from the controller 550, and may provide the plurality of scan signals SS to the plurality of pixel rows through the plurality of scan lines, respectively. In some example embodiments, the scan control signal may include, but not limited to, a scan start signal FLM, a first clock signals CLK1, a second clock signal CLK2, and a masking signal MSS. In some example embodiments, the scan driver 530 may further provide a plurality of initialization signals SI to the plurality of pixel rows. Further, in some example embodiments, a plurality of intermediate scan signals ISS generated by a plurality of first stages 532 of the scan driver 530 may be provided as the plurality of initialization signals SI to the plurality of pixel rows. In some example embodiments, the scan driver 530 may be integrated or formed in a peripheral portion of the display panel 510. In other example embodiments, the scan driver 530 may be implemented with one or more integrated circuits.

In some example embodiments, the scan driver 530 may be a scan driver 100 of FIG. 1, a scan driver 400 of FIG. 4, or the like. The scan driver 530 may include the plurality of first stages 532 that sequentially outputs the plurality of intermediate scan signals ISS based on the scan start signal FLM, a plurality of masking transistors MST that is respectively connected to a plurality of output terminals of the plurality of first stages 532, and selectively transfers the plurality of intermediate scan signals ISS in response to the masking signal MSS, respectively; and a plurality of second stages 534 that includes a plurality of input terminals respectively connected to the plurality of masking transistors MST, and selectively outputs the plurality of scan signals SS based on the plurality of intermediate scan signals ISS selectively transferred by the plurality of masking transistors MST. In the scan driver 530, the plurality of first stages 532 may sequentially output all of the plurality of intermediate scan signals ISS in a frame period, and the plurality of second stages 534 may not output at least a portion of the plurality of scan signals SS in a hold period of the frame period. Accordingly, the scan driver 530 may provide the plurality of scan signals SS at different driving frequencies to a plurality of panel regions.

The emission driver 540 may generate the emission signals SEM based on an emission control signal EMCTRL received from the controller 550, and may provide the emission signals SEM to the plurality of pixel rows through a plurality of emission lines. In some example embodiments, the emission signals SEM may be sequentially provided to the plurality of pixel rows. In other example embodiments, the emission signals SEM may be a global signal that is substantially concurrently (e.g., simultaneously) provided to the plurality of pixel rows. In some example embodiments, the emission driver 540 may be integrated or formed in the peripheral portion of the display panel 510. In other example embodiments, the emission driver 540 may be implemented with one or more integrated circuits.

The controller 550 (e.g., a timing controller (TCON)) may receive input image data DAT and a control signal CTRL from an external host (e.g., a graphic processing circuit (GPU) or a graphic card). In some example embodiments, the control signal CTRL may include, but not limited to, a vertical synchronization signal, a horizontal synchronization signal, an input data enable signal, a master clock signal, etc. The controller 550 may generate the output image data ODAT, the data control signal DCTRL, the scan control signal and the emission control signal EMCTRL based on the input image data IDAT and the control signal CTRL. The controller 550 may control an operation of the data driver 520 by providing the output image data ODAT and the data control signal DCTRL to the data driver 520, may control an operation of the scan driver 530 by providing the scan control signal to the scan driver 530, and may control an operation of the emission driver 540 by providing the emission control signal EMCTRL to the emission driver 540.

The display device 500 according to some example embodiments may perform multi-frequency driving (MFD) that drives a plurality of panel regions of the display panel 510 at a plurality of (different) driving frequencies. To perform this MFD, as illustrated in FIG. 7, the controller 550 may include a still image detection block 560, a driving frequency decision block 570 and a scan driver control block 580.

The still image detection block 560 may divide the input image data IDAT into a plurality of panel region data for a plurality of panel regions each including at least one of the plurality of pixel rows, and may determine whether or not each of the plurality of panel region data represents a still image. In some example embodiments, each panel region may include only one pixel row, and the still image detection block 560 may divide the input image data IDAT into the plurality of panel region data each for one pixel row, and may determine whether or not each panel region data for one pixel row represents the still image. In other example embodiments, each panel region may include two or more pixel rows, and the still image detection block 560 may divide the input image data IDAT into the plurality of panel region data each for two or more pixel rows, and may determine whether or not each panel region data for two or more pixel rows represents the still image.

For example, as illustrated in FIG. 9, the still image detection block 560 may divide the input image data IDAT for the display panel 510*a* into first panel region data for a first panel region PZ1 including first and second pixel rows receiving first and second scan signals SS1 and SS2, second panel region data for a second panel region PZ2 including third and fourth pixel rows receiving third and fourth scan signals SS3 and SS4, and third panel region data for a third panel region PZ3 including fifth and sixth pixel rows receiving fifth and sixth scan signals SS5 and SS6. Although FIG. 9 illustrates an example of the display panel 510*a* including the first through sixth pixel rows receiving the first through sixth scan signals SS1 through SS6, the number of the pixel rows of the display panel 510 is not limited to the example of FIG. 9. Further, although FIG. 9 illustrates an example where the display panel 510*a* is divided into the first through third panel regions PZ1, PZ2 and PZ3, the number of the panel regions PZ1, PZ2 and PZ3 is not limited to the example of FIG. 9.

In some example embodiments, with respect to each panel region data, the still image detection block 560 may determine whether or not the panel region data represents the still image by comparing the panel region data in a previous frame period and the panel region data in a current frame period. For example, the still image detection block 560 may determine that the panel region data represents the still image in a case where the panel region data in the current frame period is substantially the same as the panel region data in the previous frame period, and may determine that the panel region data does not represent the still image or represents a moving image in a case where the panel region data in the current frame period is different from the panel region data in the previous frame period.

In other example embodiments, with respect to each panel region data, the still image detection block 560 may determine whether or not the panel region data represents the still image by comparing a previous representative value (e.g., an average value or a checksum) of the panel region data in the previous frame period and a current representative value of the panel region data in the current frame period. For example, as illustrated in FIG. 9, the still image detection block 560 may determine that the first panel region data for the first panel region PZ1 represents the still image in a case where the current representative value of the first panel region data is the same as the previous representative value of the first panel region data, may determine that the second panel region data for the second panel region PZ2 represents the moving image in a case where the current representative value of the second panel region data is different from the previous representative value of the second panel region data, and may determine that the third panel region data for the third panel region PZ3 represents the still image in a case where the current representative value of the third panel region data is the same as the previous representative value of the third panel region data.

The driving frequency decision block 570 may determine a plurality of driving frequencies for the plurality of panel regions according to whether or not each of the plurality of panel region data represents the still image. In some example embodiments, in a case where each panel region data represents the moving image, the driving frequency decision block 570 may determine the driving frequency for the panel region corresponding to the panel region data as a normal driving frequency. Here, the normal driving frequency may be a driving frequency in normal driving of the display device 500. In some example embodiments, the normal driving frequency may be the same as an input frame frequency (e.g., about 60 Hz or about 120 Hz) of the input image data IDAT. Further, in a case where each panel region data represents the still image, the driving frequency decision block 570 may determine the driving frequency for the panel region corresponding to the panel region data as a low frequency lower than the normal driving frequency. Here, the low frequency may be any frequency lower than the normal driving frequency. In some example embodiments, in a case where each panel region data represents the still image, the driving frequency decision block 570 may determine a flicker value corresponding to a gray level (or luminance) of the panel region data by using a flicker lookup table, and may determine the driving frequency for the panel region corresponding to the panel region data based on the flicker value. For example, the flicker lookup table may store flicker values respectively corresponding to image data gray levels (e.g., 256 gray levels from 0-gray level to 255-gray level). Here, the flicker value may represent a level of a flicker perceived by a user. According to some example embodiments, determining the flicker value and the driving frequency may be performed on a pixel-by-pixel basis, a segment-by-segment basis, or a panel region-by-panel region basis. For example, each panel region data may be divided into a plurality of segment data for a plurality of segments, flicker values for the respective segments may be determined by using the flicker lookup table, segment driving frequencies for the respective segments may be determined, and the driving frequency for the panel region may be determined as the maximum one of the segment driving frequencies.

For example, as illustrated in FIG. 9, in a case where each of the first and third panel region data for the first and third panel regions PZ1 and PZ3 represents the moving image, the driving frequency decision block 570 may determine first and third driving frequencies DF1 and DF3 for the first and third panel regions PZ1 and PZ3 as the normal driving frequency, for example about 60 Hz. Further, in a case where the second panel region data for the second panel region PZ2 represents the still image, the driving frequency decision block 570 may determine a second driving frequency DF2 for the second panel region PZ2 as the low frequency lower than the normal driving frequency. For example, the driving frequency decision block 570 may determine a flicker value according to a gray level (or luminance) of the second panel region data, and may determine the second driving frequency DF2 for the second panel region PZ2 as about 20 Hz lower than the normal driving frequency according to the flicker value.

The scan driver control block 580 may generate the masking signal MSS based on the plurality of driving frequencies for the plurality of panel regions. In some example embodiments, the scan driver control block 580 may set at least a portion of one or more frame periods as a hold period, may change the masking signal MSS to an off level before one horizontal time from a start time point of the hold period, and may change the masking signal to an on level before one horizontal time from an end time point of the hold period.

For example, as illustrated in FIGS. 7, 9 and 10, the plurality of first stages 532 may sequentially generate the plurality of intermediate scan signals ISS1 through ISS6 in each frame period FP1 through FP4. The scan driver control block 580 may set at least a portion of one or more frame periods FP2 and FP3 as the hold period HP according to the plurality of driving frequencies DF1, DF2 and DF3 for the plurality of panel regions PZ1, PZ2 and PZ3. For example, in a case of the second driving frequency DF2 for the second panel region PZ2 is the low frequency of about 20 Hz, two frame periods FP2 and FP3 from among three frame periods FP1, FP2 and FP3 may include the hold period HP in a partial period in which the third and fourth scan signals SS3 and SS4 are provided to the second panel region PZ2. Further, the scan driver control block 580 may change the masking signal MSS to the off level before one horizontal time from the start time point of the hold period HP, and may change the masking signal MSS to the on level before one horizontal time from the end time point of the hold period HP. In response to this masking signal MSS, the plurality of masking transistors MST may transfer first through sixth intermediate scan signals ISS1 through ISS6 to the plurality of second stages 534 in a first frame period FP1, and may transfer only the first, second, fifth and sixth intermediate scan signals ISS1, ISS2, ISS5 and ISS6 to the plurality of second stages 534 while not transferring the third and fourth intermediate scan signals ISS3 and ISS4 in each of second and third frame periods FP2 and FP3.

Accordingly, the plurality of second stages 534 may provide the first through sixth scan signals SS1 through SS6 to the first through third panel regions PZ1, PZ2 and PZ3 in the first frame period FP1, and may provide only the first, second, fifth and sixth scan signals SS1, SS2, SS5 and SS6 to the first and third panel regions PZ1 and PZ3 while not providing the third and fourth scan signals SS3 and SS4 to the second panel region PZ2 in each of second and third frame periods FP2 and FP3. Further, the controller 550 may provide the first through third panel region data PD1, PD2 and PD3 for the first through third panel regions PZ1, PZ2 and PZ3 to the data driver 520 in the first frame period FP1, and may provide only the first and third panel region data PD1 and PD3 for the first and third panel regions PZ1 and PZ3 to the data driver 520 while not providing the second panel region data PD2 for the second panel region PZ2 to the data driver 520 in each of second and third frame periods FP2 and FP3. Accordingly, the first and third panel regions PZ1 and PZ3 may be driven at the normal driving frequency of about 60 Hz, and the second panel region PZ2 may be driven at the low frequency of about 20 Hz.

As described above, in the display device 500 according to some example embodiments, the plurality of first stages 532 may sequentially output the plurality of intermediate scan signals ISS, the plurality of masking transistors MST may selectively transfer the plurality of intermediate scan signals ISS in response to the masking signal MSS, respectively, and the plurality of second stages 534 may selectively output the plurality of scan signals SS based on the plurality of intermediate scan signals ISS selectively transferred by the plurality of masking transistors MST. Accordingly, the display device 500 according to some example embodiments may perform the multi-frequency driving that drives the plurality of panel regions PZ1, PZ2 and PZ3 at different driving frequencies DF1, DF2 and DF3.

Figure 11:
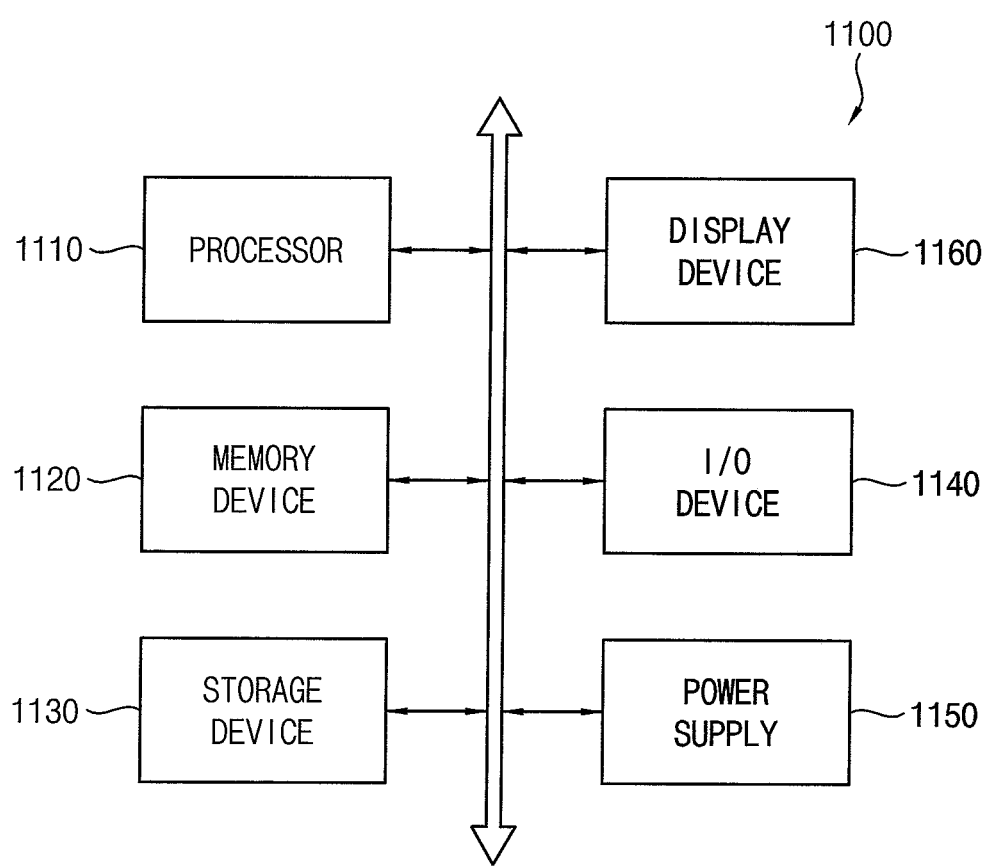
FIG. 11 is an electronic device including a display device according to some example embodiments.

FIG. 11 is an electronic device including a display device according to some example embodiments.

Referring to FIG. 11, an electronic device 1100 may include a processor 1110, a memory device 1120, a storage device 1130, an input/output (I/O) device 1140, a power supply 1150, and a display device 1160. The electronic device 1100 may further include a plurality of ports for communicating a video card, a sound card, a memory card, a universal serial bus (USB) device, other electric devices, etc.

The processor 1110 may perform various computing functions or tasks. The processor 1110 may be an application processor (AP), a micro processor, a central processing unit (CPU), etc. The processor 1110 may be connected to other components via an address bus, a control bus, a data bus, etc. Further, in some example embodiments, the processor 1110 may be further connected to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc, and an output device such as a printer, a speaker, etc. The power supply 1150 may supply power for operations of the electronic device 1100. The display device 1160 may be connected to other components through the buses or other communication links.

In the display device 1160, a plurality of first stages of a scan driver may sequentially output a plurality of intermediate scan signals, a plurality of masking transistors of the scan driver may selectively transfer the plurality of intermediate scan signals in response to a masking signal, respectively, and a plurality of second stages of the scan driver may selectively output a plurality of scan signals based on the plurality of intermediate scan signals selectively transferred by the plurality of masking transistors. Accordingly, the scan driver may provide the plurality of scan signals at different driving frequencies to a plurality of panel regions, and the display device 1160 may perform multi-frequency driving that drives the plurality of panel regions at the different driving frequencies.

The inventive concepts may be applied to any display device 1160, and any electronic device 1100 including the display device 1160. For example, the inventive concepts may be applied to a mobile phone, a smart phone, a wearable electronic device, a tablet computer, a television (TV), a digital TV, a 3D TV, a personal computer (PC), a home appliance, a laptop computer, a personal digital assistant (PDA), a portable multimedia player (PMP), a digital camera, a music player, a portable game console, a navigation device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and characteristics of embodiments according to the present inventive concept. Accordingly, all such modifications are intended to be included within the scope of embodiments according to the present inventive concept as defined in the claims and their equivalents. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. A scan driver comprising:
    a plurality of first stages configured to sequentially output a plurality of intermediate scan signals based on a scan start signal;
    a plurality of masking transistors respectively connected to a plurality of output terminals of the plurality of first stages, and configured to selectively transfer the plurality of intermediate scan signals in response to a masking signal, respectively, wherein the output terminal of a stage of the first stages is electrically connected to an input terminal of a next stage from among the first stages to enable a signal from the output terminal of the stage of the first stages to pass to the input terminal of the next stage without passing through a corresponding masking transistor of the masking transistors; and
    a plurality of second stages including a plurality of input terminals respectively connected to the plurality of masking transistors, and configured to selectively output a plurality of scan signals based on the plurality of intermediate scan signals selectively transferred by the plurality of masking transistors, wherein the masking transistors are respectively connected between corresponding ones of the output terminals of the first stages and the input terminals of the second stages.

2. The scan driver of claim 1, wherein the plurality of first stages is configured to sequentially output all of the plurality of intermediate scan signals in a frame period, and
    wherein the plurality of second stages is configured to not output at least a portion of the plurality of scan signals in a hold period of the frame period.

3. The scan driver of claim 2, wherein the masking signal is changed to an off level before one horizontal time from a start time point of the hold period, and is changed to an on level before one horizontal time from an end time point of the hold period.

4. The scan driver of claim 3, wherein each of the plurality of masking transistors is configured to not transfer a corresponding one of the plurality of intermediate scan signals in response to the masking signal having the off level, and is configured to transfer the corresponding one of the plurality of intermediate scan signals to a corresponding one of the plurality of second stages in response to the masking signal having the on level.

5. The scan driver of claim 1, wherein each of the plurality of masking transistors includes a gate configured to receive the masking signal, a first terminal connected to a corresponding one of the plurality of output terminals of the plurality of first stages, and a second terminal connected to a corresponding one of the plurality of input terminals of the plurality of second stages.

6. The scan driver of claim 1, wherein each of the plurality of scan signals selectively output from the plurality of second stages is delayed by one horizontal time with respect to a corresponding one of the plurality of intermediate scan signals output from the plurality of first stages.

7. The scan driver of claim 1, wherein a K-th one of the plurality of first stages is configured to output a K-th one of the plurality of intermediate scan signals based on a (K−1)-th one of the plurality of intermediate scan signals output from a (K−1)-th one of the plurality of first stages, where K is an integer greater than 1, and
    wherein a K-th one of the plurality of second stages is configured to selectively output a K-th one of the plurality of scan signals based on the K-th one of the plurality of intermediate scan signals selectively transferred by a K-th one of the plurality of masking transistors.

8. The scan driver of claim 1, wherein each of the plurality of second stages has a same structure as each of the plurality of first stages.

9. The scan driver of claim 1, wherein each of the plurality of first stages and the plurality of second stages comprises:
    an input circuit configured to transfer an input signal to a first node in response to a first clock signal;
    a stress relaxing circuit between the first node and a second node, and configured to transfer the input signal from the first node to the second node such that a voltage of the second node is changed to a first on level;
    a bootstrap circuit configured to change the voltage of the second node from the first on level to a second on level by bootstrapping the second node based on a second clock signal, the second on level having an absolute value greater than an absolute value of the first on level;
    a scan output circuit configured to output the second clock signal as an output signal in response to the voltage of the second node having the second on level;
    a holding circuit configured to hold a third node as an off level while the output signal is output; and
    a stabilizing circuit configured to periodically apply a gate on voltage to the third node in response to the second clock signal, and to periodically apply a gate off voltage to the first node in response to the first clock signal after the output signal is output.

10. The scan driver of claim 9, wherein the input circuit comprises:
    a first transistor including a gate configured to receive the first clock signal, a first terminal configured to receive the input signal, and a second terminal connected to the first node,
    wherein the bootstrap circuit comprises:
    a first capacitor including a first electrode connected to a scan output node at which the output signal is output, and a second electrode connected to the second node,
    wherein the holding circuit comprises:

a fourth transistor including a gate connected to the first node, a first terminal connected to the third node, and a second terminal configured to receive the first clock signal, wherein the stabilizing circuit comprises:

a second transistor including a gate connected to the third node, a first terminal configured to receive the gate off voltage, and a second terminal;

a third transistor including a gate configured to receive the second clock signal, a first terminal connected to the second terminal of the second transistor, and a second terminal connected to the first node;

a fifth transistor including a gate configured to receive the first clock signal, a first terminal connected to the third node, and a second terminal configured to receive the gate on voltage; and a second capacitor including a first electrode configured to receive the gate off voltage, and a second electrode connected to the third node, wherein the scan output circuit comprises:

a sixth transistor including a gate connected to the third node, a first terminal configured to receive the gate off voltage, and a second terminal connected to the scan output node; and a seventh transistor including a gate connected to the second node, a first terminal connected to the scan output node, and a second terminal configured to receive the second clock signal, and wherein the stress relaxing circuit comprises:

an eighth transistor including a gate configured to receive the gate on voltage, a first terminal connected to the first node, and a second terminal connected to the second node.

11. The scan driver of claim 1, wherein a K-th one of the plurality of first stages is configured to output a K-th one of the plurality of intermediate scan signals based on a previous carry signal output from a (K−1)-th one of the plurality of first stages, where K is an integer greater than 1, and wherein a K-th one of the plurality of second stages is configured to selectively output a K-th one of the plurality of scan signals based on the K-th one of the plurality of intermediate scan signals selectively transferred by a K-th one of the plurality of masking transistors.

12. The scan driver of claim 1, wherein, compared with each of the plurality of second stages, each of the plurality of first stages further includes a carry output circuit.

13. The scan driver of claim 12, wherein the carry output circuit comprises:

a first transistor including a gate connected to a third first node, a first terminal configured to receive a gate off voltage, and a second terminal connected to a carry output node at which a carry signal is output; and a second transistor including a gate connected to a second node, a first terminal connected to the carry output node, and a second terminal configured to receive a second clock signal.

14. The scan driver of claim 1, further comprising:

a plurality of switching transistors configured to transfer a gate off voltage to the plurality of input terminals of the plurality of second stages in response to an inverted masking signal that is an inversion signal of the masking signal.

15. The scan driver of claim 14, wherein each of the plurality of switching transistors includes a gate configured to receive the inverted masking signal, a first terminal configured to receive the gate off voltage, and a second terminal connected to a corresponding one of the plurality of input terminals of the plurality of second stages.

16. The scan driver of claim 1, wherein the plurality of scan signals are selectively provided to a plurality of pixels included in a display device including the scan driver, and wherein the plurality of intermediate scan signals are provided as a plurality of initialization signals to the plurality of pixels.

17. A display device comprising:

a display panel including a plurality of pixel rows;

a data driver configured to provide data signals to each of the plurality of pixel rows;

a scan driver configured to respectively provide a plurality of scan signals to the plurality of pixel rows; and a controller configured to control the data driver and the scan driver, and to provide a scan start signal and a masking signal to the scan driver, where the scan driver comprises:

a plurality of first stages configured to sequentially output a plurality of intermediate scan signals based on the scan start signal;

a plurality of masking transistors respectively connected to a plurality of output terminals of the plurality of first stages, and configured to selectively transfer the plurality of intermediate scan signals in response to the masking signal, respectively, wherein the output terminal of a stage of the first stages is electrically connected to an input terminal of a next stage from among the first stages to enable a signal from the output terminal of the stage of the first stages to pass to the input terminal of the next stage without passing through a corresponding masking transistor of the masking transistors; and a plurality of second stages including a plurality of input terminals respectively connected to the plurality of masking transistors, and configured to selectively output a plurality of scan signals based on the plurality of intermediate scan signals selectively transferred by the plurality of masking transistors, wherein the masking transistors are respectively connected between corresponding ones of the output terminals of the first stages and the input terminals of the second stages.

18. The display device of claim 17, wherein the plurality of first stages is configured to sequentially output all of the plurality of intermediate scan signals in a frame period, and wherein the plurality of second stages is configured to not output at least a portion of the plurality of scan signals in a hold period of the frame period.

19. The display device of claim 17, wherein the controller comprises:

a still image detection block configured to divide input image data into a plurality of panel region data for a plurality of panel regions each including at least one of the plurality of pixel rows, and to determine whether or not each of the plurality of panel region data represents a still image;

a driving frequency decision block configured to determine a plurality of driving frequencies for the plurality of panel regions according to whether or not each of the plurality of panel region data represents the still image; and a scan driver control block configured to generate the masking signal based on the plurality of driving frequencies for the plurality of panel regions.

20. The display device of claim 19, wherein the scan driver control block is configured to set at least a portion of one or more frame periods as a hold period, change the masking signal to an off level before one horizontal time from a start time point of the hold period, and change the masking signal to an on level before one horizontal time from an end time point of the hold period.

* * * * *